United States Patent
Fukuzumi et al.

(10) Patent No.: US 9,786,679 B2
(45) Date of Patent: Oct. 10, 2017

(54) METHOD FOR MANUFACTURING SEMICONDUCTOR MEMORY DEVICE

(71) Applicant: Toshiba Memory Corporation, Minato-ku (JP)

(72) Inventors: Yoshiaki Fukuzumi, Yokkaichi (JP); Hideaki Aochi, Yokkaichi (JP); Mitsuhiro Omura, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/844,250

(22) Filed: Sep. 3, 2015

(65) Prior Publication Data

US 2016/0276363 A1 Sep. 22, 2016

(30) Foreign Application Priority Data

Mar. 16, 2015 (JP) ................... 2015-051711

(51) Int. Cl.
| H01L 27/115 | (2017.01) |
| H01L 27/112 | (2006.01) |
| H01L 27/11582 | (2017.01) |
| H01L 27/11565 | (2017.01) |

(52) U.S. Cl.
CPC .. *H01L 27/11582* (2013.01); *H01L 27/11565* (2013.01)

(58) Field of Classification Search
CPC ........... H01L 27/11578; H01L 27/1158; H01L 27/11582
See application file for complete search history.

(56) References Cited

U.S. PATENT DOCUMENTS

| 7,936,004 | B2 | 5/2011 | Kito et al. |
| 8,372,720 | B2 | 2/2013 | Fukuzumi et al. |
| 8,435,857 | B2 | 5/2013 | Kiyotoshi |
| 8,476,708 | B2 | 7/2013 | Fukuzumi et al. |
| 8,729,624 | B2 | 5/2014 | Fukuzumi et al. |
| 9,035,374 | B2 | 5/2015 | Fukuzumi et al. |
| 2012/0241844 | A1 | 9/2012 | Iguchi et al. |
| 2012/0326223 | A1 | 12/2012 | Omura |
| 2013/0058163 | A1 | 3/2013 | Kito et al. |
| 2015/0200204 | A1 | 7/2015 | Fukuzumi et al. |
| 2016/0104718 | A1* | 4/2016 | Omura .............. H01L 27/11582 438/269 |

* cited by examiner

*Primary Examiner* — Robert Bachner
*Assistant Examiner* — Molly Reida
(74) *Attorney, Agent, or Firm* — Oblon, McClelland, Maier & Neustadt, L.L.P.

(57) ABSTRACT

According to one embodiment, a method for manufacturing a semiconductor memory device includes forming a mask layer on the stacked body. The method includes forming a stopper film in a part of the mask layer. The method includes forming a plurality of mask holes in the mask layer. The mask holes include a first mask hole overlapping on the stopper film. The method includes, by etching using the mask layer, forming holes in the stacked body under other mask holes than the first mask hole on the stopper film, but not forming holes in the stacked body under the stopper film. The method includes forming memory films and channel bodies in the holes.

20 Claims, 29 Drawing Sheets

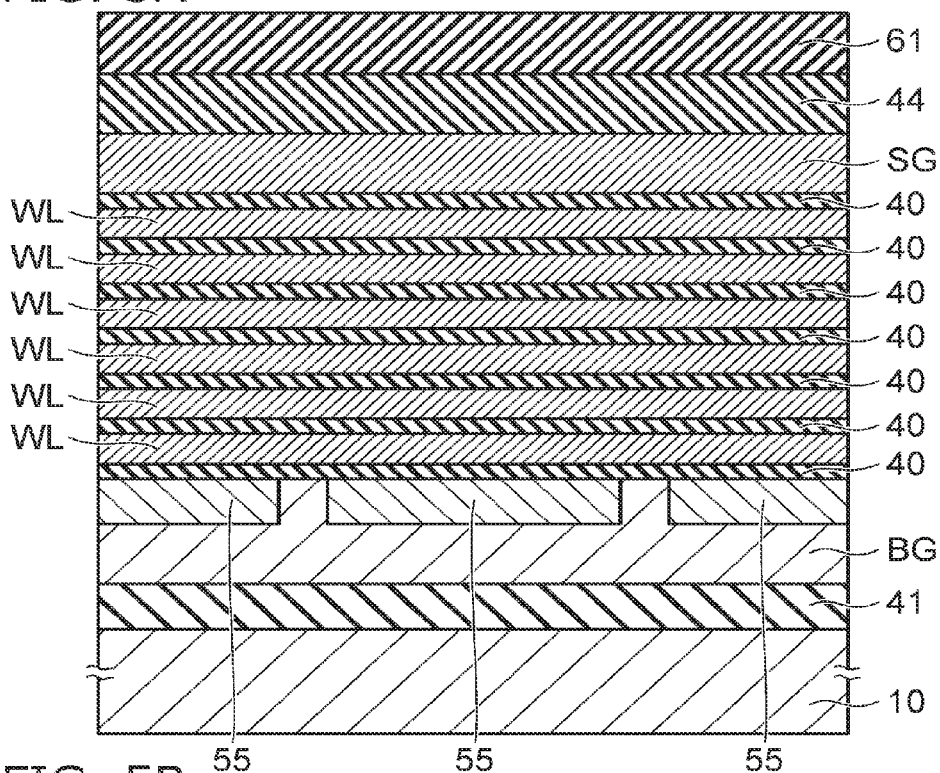
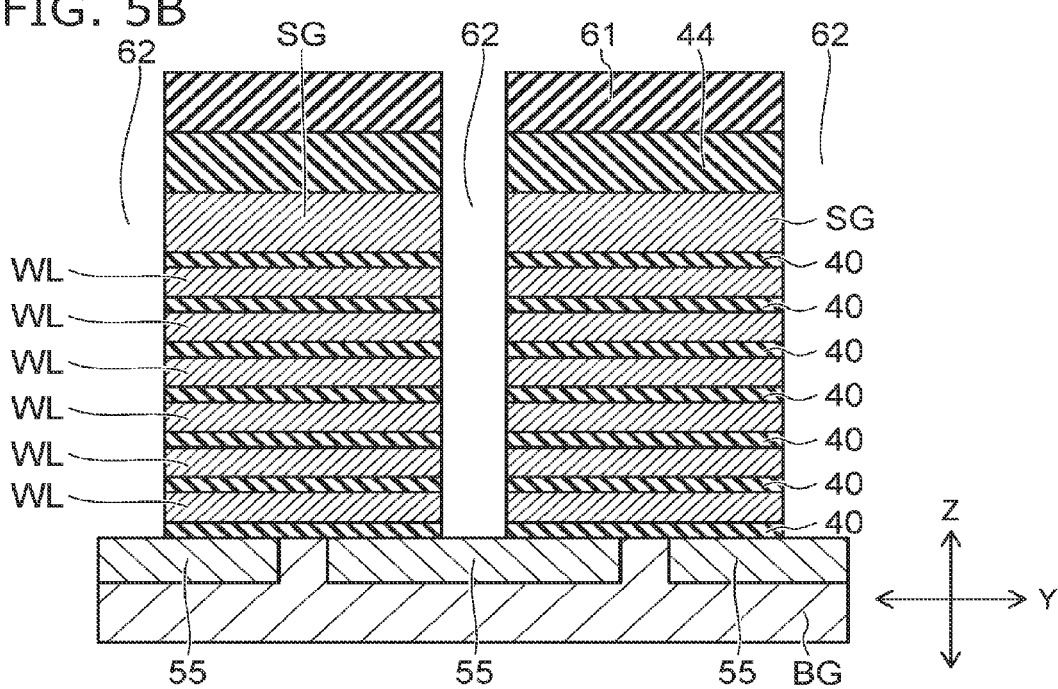

METHOD FOR MANUFACTURING SEMICONDUCTOR MEMORY DEVICE

CROSS-REFERENCE TO RELATED APPLICATIONS

This application is based upon and claims the benefit of priority from Japanese Patent Application No. 2015-051711, filed on Mar. 16, 2015; the entire contents of which are incorporated herein by reference.

FIELD

Embodiments described herein relate generally to a method for manufacturing a semiconductor memory device.

BACKGROUND

A memory cell array having three-dimensional structure is proposed. The memory cell array includes a stacked body including a plurality of electrode layers stacked via insulating layers. The electrode layer functions as a control gate in a memory cell. A memory hole is formed in the stacked body. A silicon body as a channel is provided on a side wall of the memory hole via a charge storage film.

In the memory cell array having the three-dimensional structure, when the number of stacked electrode layers increases and the aspect ratio of the memory hole is higher with increase of storage capacity, it tends to be difficult to form the hole with higher roundness in the stacking direction in uniform diameter.

BRIEF DESCRIPTION OF THE DRAWINGS

FIG. 5A to FIG. 18B are schematic views showing a method for manufacturing the semiconductor memory device of the first embodiment;

DETAILED DESCRIPTION

Figure 1:
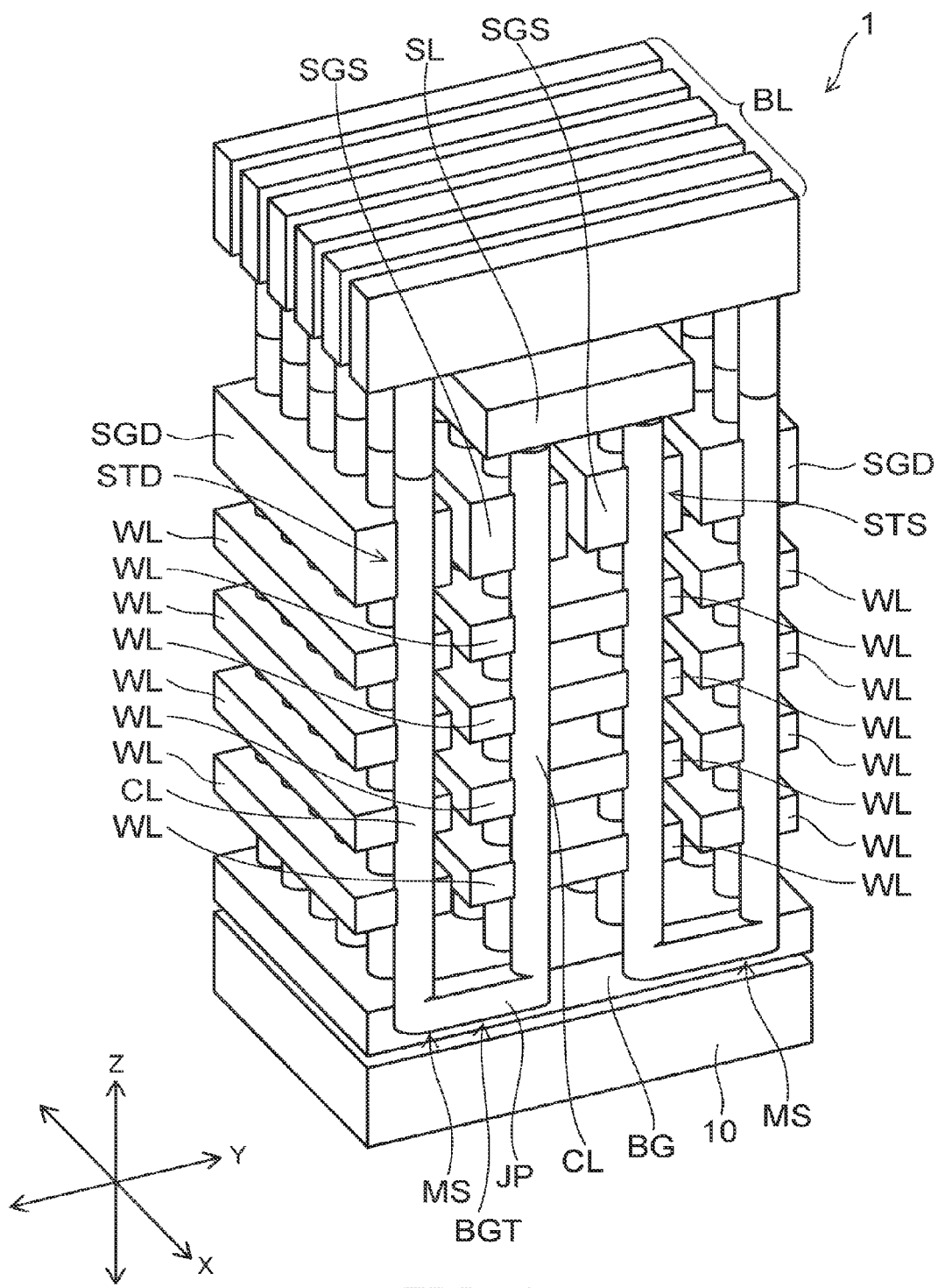
FIG. 1 is a schematic perspective view of a memory cell array of a semiconductor memory device of a first embodiment.

According to one embodiment, a method for manufacturing a semiconductor memory device includes forming a stacked body on a substrate. The stacked body includes a plurality of first layers and a plurality of second layers respectively provided between the first layers. The method includes forming a mask layer on the stacked body. The method includes forming a stopper film of a different material from a material of the stacked body in a part of the mask layer. The method includes forming a plurality of mask holes in the mask layer. The mask holes include a first mask hole overlapping on the stopper film. The method includes, by etching using the mask layer, forming holes in the stacked body under other mask holes than the first mask hole on the stopper film, but not forming holes in the stacked body under the stopper film. The method includes forming memory films and channel bodies in the holes.

Embodiments will now be described with reference to the drawings. In the respective drawings, like members are labeled with like reference numerals.

FIG. 1 is a schematic perspective view of a memory cell array 1 of a semiconductor memory device of the first embodiment. In FIG. 1, to facilitate visualization, insulating layers, insulating isolation films, etc. are not shown.

In FIG. 1, two directions in parallel to a major surface of a substrate 10 and orthogonal to each other are an X-direction and a Y-direction, and a direction orthogonal to both the X-direction and the Y-direction is a Z-direction (stacking direction).

Figure 2:
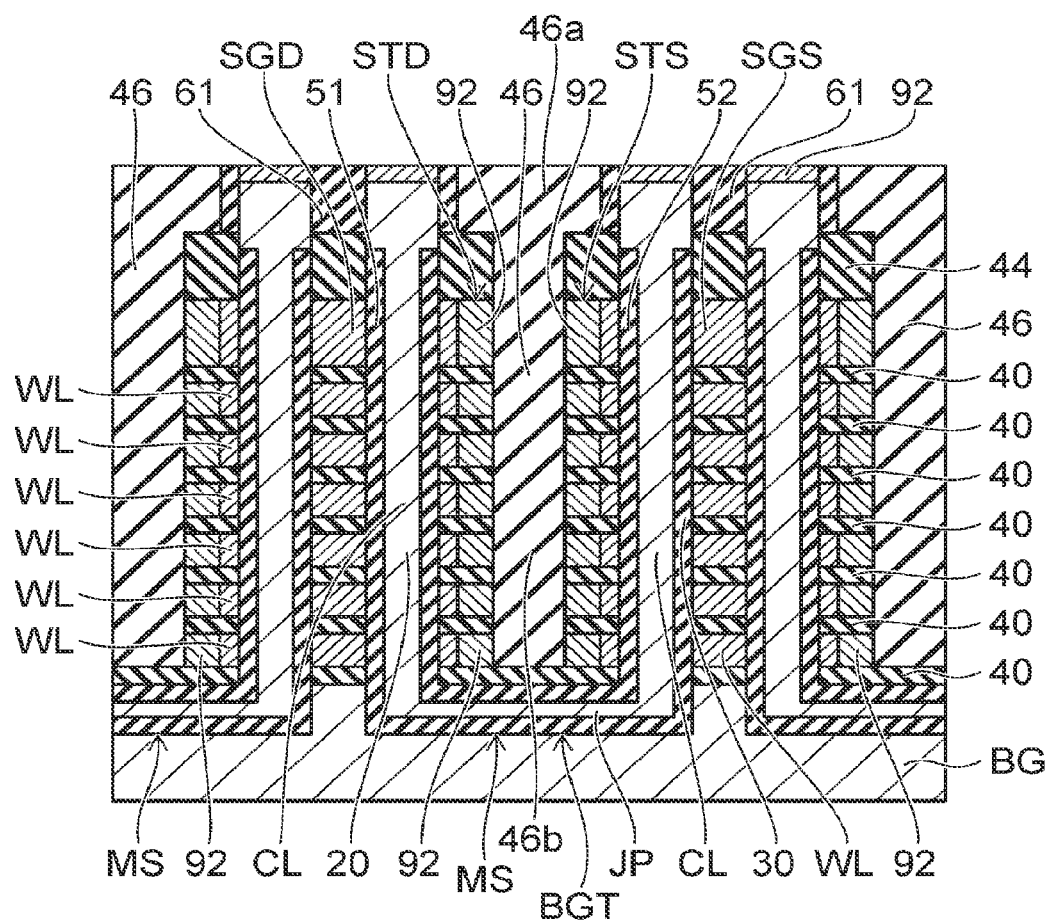
FIG. 2 is a schematic sectional view of a memory string of the first embodiment.

The memory cell array 1 has a plurality of memory strings MS. FIG. 2 is a schematic sectional view of the memory strings MS. FIG. 2 shows a section in parallel to the YZ-plane in FIG. 1.

The memory cell array 1 has a stacked body in which electrode layers WL and insulating layers 40 are alternately stacked one by one. The stacked body is provided on a back gate BG as a lower gate layer. The number of electrode layers WL shown in the drawings is just an example, and the number of electrode layers WL is arbitrary.

The back gate BG is provided on the substrate 10 via an insulating layer (not shown). The back gate BG and the electrode layers WL are layers containing silicon as a major component. Further, the back gate BG and the electrode layers WL contain e.g. boron as an impurity for providing conductivity to the silicon layers. The insulating layers 40 mainly contain e.g. silicon oxide.

One memory string MS is formed in a U-shape having a pair of columnar parts CL extending in the Z-direction and a joining part JP that joints the respective lower ends of the pair of columnar parts CL. The columnar parts CL are formed in e.g. circular cylinder shapes or elliptic cylinder shapes through the stacked body and reach the back gate BG.

A drain-side selection gate SGD is provided in one upper end portion of the pair of columnar parts CL in the U-shaped memory string MS, and a source-side selection gate SGS is provided in the other upper end portion. The drain-side selection gate SGD and the source-side selection gate SGS are provided on the uppermost electrode layers WL via the insulating layers 40.

The drain-side selection gate SGD and the source-side selection gate SGS are layers containing silicon as a major component. Further, the drain-side selection gate SGD and the source-side selection gate SGS contain e.g. boron as an impurity for providing conductivity to the silicon layers.

The drain-side selection gate SGD and the source-side selection gate SGS as upper selection gates and the back gate BG as a lower selection gate are thicker than the single electrode layer WL.

Insulating layers 44 are provided on the drain-side selection gate SGD and the source-side selection gate SGS. Insulating layers 61 are provided on the insulating layers 44. For instance, the insulating layers 44 are silicon oxide layer and the insulating layers 61 are BSG (boron doped silicate glass) layers.

The drain-side selection gate SGD and the source-side selection gate SGS are isolated by an insulating isolation film 46 in the Y-direction. The stacked body under the drain-side selection gate SGD and the stacked body under the source-side selection gate SGS are also isolated by the insulating isolation film 46 in the Y-direction. Namely, the stacked body between the pair of columnar parts CL of the memory string MS is isolated by the insulating isolation film 46 in the Y-direction.

The insulating isolation film 46 extends in the X-direction (the direction orthogonal to the paper surface in FIG. 2). The insulating isolation film 46 has an upper portion 46a and a lower portion 46b. The lower portion 46b is adjacent to the electrode layers WL, the drain-side selection gate SGD, and the source-side selection gate SGS below the upper portion 46a. The upper portion 46a of the insulating isolation film 46 has a larger width (a width in the Y-direction) than the lower portion 46b. Namely, the insulating isolation film 46 has a T-shaped section shape.

Steps are formed on the insulating layers 44, 61 provided above the drain-side selection gate SGD and the source-side selection gate SGS, and the insulating isolation film 46 is provided to cover the steps.

In the electrode layers WL, the drain-side selection gate SGD, and the source-side selection gate SGS, Metal silicides 92 are formed in end portions contiguous to the insulating isolation films 46.

A source line (e.g. a metal film) SL shown in FIG. 1 is provided on the source-side selection gates SGS via insulating layers. On the drain-side selection gates SGD and on the source line SL, a plurality of bit lines (e.g. metal films) BL shown in FIG. 1 are provided via insulating layers. The respective bit lines BL extend in the Y-direction.

Figure 3:
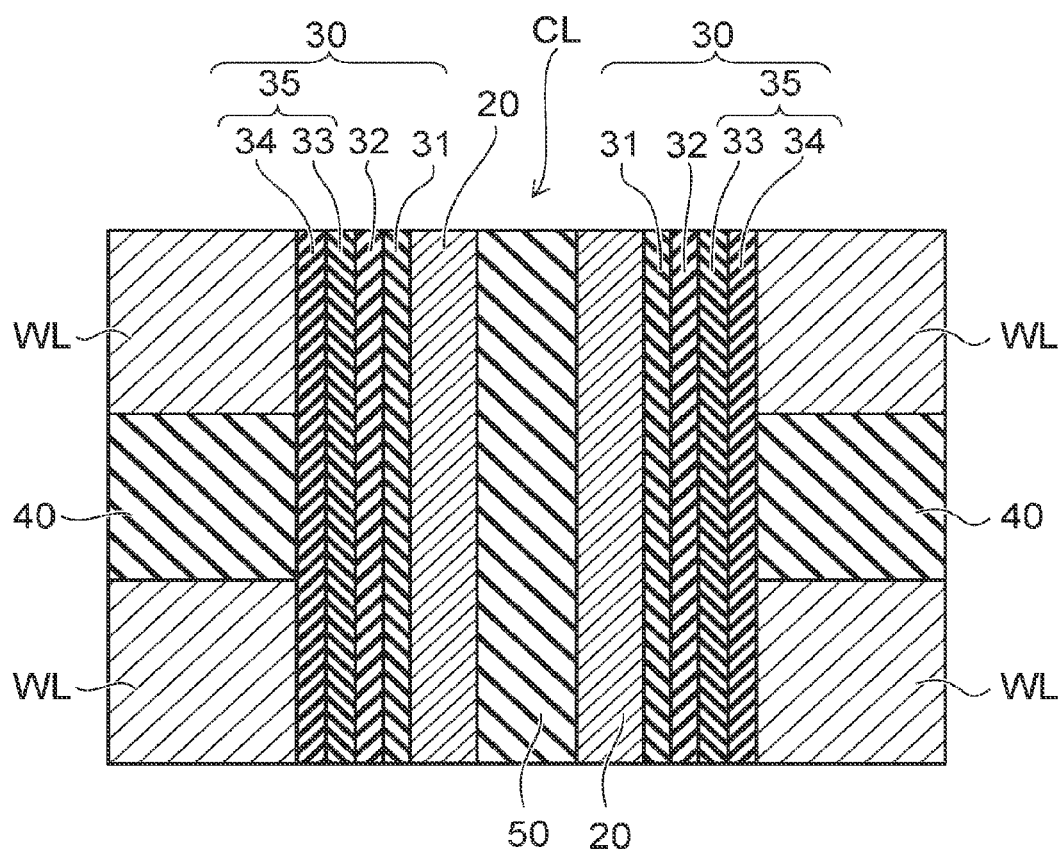
FIG. 3 is a schematic sectional view of the memory cell of the embodiment.

FIG. 3 is an enlarged schematic sectional view of a part of the columnar part CL.

The respective films forming the columnar part CL are formed within a U-shaped memory hole MH shown in FIG. 11B, which will be described later. The memory hole MH is formed within the stacked body including the plurality of electrode layers WL, the plurality of insulating layers 40, and the back gate BG.

A channel body 20 as a semiconductor channel is provided within the memory hole MH. The channel body 20 is e.g. a silicon film. The impurity concentration of the channel body 20 is lower than the impurity concentration of the electrode layer WL.

A memory film 30 is provided between the inner wall of the memory hole MH and the channel body 20. The memory film 30 has a block insulating film 35, a charge storage film 32, and a tunnel insulating film 31.

Between the electrode layers WL and the channel body 20, the block insulating film 35, the charge storage film 32, and the tunnel insulating film 31 are sequentially provided from the electrode layer WL side.

The channel body 20 is provided in a tubular shape extending in the stacking direction of the stacked body and the memory film 30 is provided to extend in a tubular shape in the stacking direction of the stacked body to surround the outer circumferential surface of the channel body 20. The electrode layers WL surround the channel body 20 via the memory film 30. Further, a core insulating film 50 is provided inside of the channel body 20. The core insulating film 50 is e.g. a silicon oxide film.

The block insulating film 35 is in contact with the electrode layers WL, the tunnel insulating film 31 is in contact with the channel body 20, and the charge storage film 32 is provided between the block insulating film 35 and the tunnel insulating film 31.

The channel body 20 functions as a channel in the memory cells and the electrode layers WL function as control gates of the memory cells. The charge storage film 32 functions as a data memory layer that accumulates charge injected from the channel body 20. Namely, the memory cells having structures in which the control gates surround the channel are formed in intersection parts between the channel body 20 and the respective electrode layers WL.

The semiconductor memory device of the embodiment is a nonvolatile semiconductor memory device that may electrically freely erase and write data and hold memory contents after power is turned off.

The memory cell is e.g. a charge-trap memory cell. The charge storage film 32 has many trap sites for trapping charge and is e.g. a silicon nitride film.

The tunnel insulating film 31 serves as a potential barrier when charge is injected from the channel body 20 into the charge storage film 32 or when the charge accumulated in the charge storage film 32 is diffused into the channel body 20. The tunnel insulating film 31 is e.g. a silicon oxide film.

Or, as the tunnel insulating film, a stacked film having a structure in which a silicon nitride film is sandwiched by a pair of silicon oxide films (ONO film) may be used. The tunnel insulating film using the ONO film enables erasing operation in the lower electric field than that for a single layer of the silicon oxide film.

The block insulating film 35 prevents the charge accumulated in the charge storage film 32 from diffusing into the electrode layers WL. The block insulating film 35 has a cap film 34 provided in contact with the electrode layers WL and a block film 33 provided between the cap film 34 and the charge storage film 32.

The block film 33 is e.g. a silicon oxide film. The cap film 34 is a film having higher permittivity than silicon oxide, e.g. a silicon nitride film. The cap film 34 is provided in contact with the electrode layers WL, and thereby, back tunnel electrons injected from the electrode layers WL at erasing may be suppressed. Namely, the stacked film of the silicon oxide film and the silicon nitride film is used as the block insulating film 35, and thereby, the charge blocking property may be improved.

As shown in FIGS. 1 and 2, a drain-side selection transistor STD is provided in one upper end portion of the pair of columnar parts CL in the U-shaped memory string MS, and a source-side selection transistor STS is provided in the other upper end portion.

The memory cell, the drain-side selection transistor STD, and the source-side selection transistor STS are vertical transistors in which currents flow in the stacking direction (Z-direction) of the stacked body stacked on the substrate 10.

The drain-side selection gate SGD functions as a gate electrode (control gate) of the drain-side selection transistor STD. Between the drain-side selection gate SGD and the channel body 20, an insulating film 51 (FIG. 2) functioning as a gate insulating film of the drain-side selection transistor STD is provided. The channel body 20 of the drain-side selection transistor STD is connected to the bit line above the drain-side selection gate SGD.

The source-side selection gate SGS functions as a gate electrode (control gate) of the source-side selection transistor STS. Between the source-side selection gate SGS and the channel body 20, an insulating film 52 (FIG. 2) functioning as a gate insulating film of the source-side selection transistor STS is provided. The channel body 20 of the source-side selection transistor STS is connected to the source line SL above the source-side selection gate SGS.

A back gate transistor BGT is provided in the joining part JP of the memory string MS. The back gate BG functions as a gate electrode (control gate) of the back gate transistor BGT. The memory film 30 provided within the back gate BG functions as a gate insulating film of the back gate transistor BGT.

The plurality of memory cells with the respective electrode layers WL as control gates are provided between the drain-side selection transistor STD and the back gate transistor BGT. Similarly, the plurality of memory cells with the respective electrode layers WL as control gates are also provided between the back gate transistor BGT and the source-side selection transistor STS.

The plurality of memory cells, the drain-side selection transistor STD, the back gate transistor BGT, and the source-side selection transistor STS are series-connected through the channel body 20 to form the single U-shaped memory string MS. A plurality of the memory strings MS are arranged in the X-direction and the Y-direction, and thereby, the plurality of memory cells are three-dimensionally provided in the X-direction, the Y-direction, and the Z-direction.

Next, referring to FIGS. 5A to 13B, a method for manufacturing the semiconductor memory device of the first embodiment will be described.

As shown in FIG. 5A, the back gate BG is formed on the substrate 10 via the insulating layer 41. Concave portions are formed in the back gate BG and sacrifice films 55 are buried within the concave portions. The sacrifice films 55 are e.g. silicon nitride films. The parts in which the sacrifice films 55 (concave portions) are formed serve as the joining parts JP of the memory strings MS. Note that, in the subsequent process sectional views, the substrate 10 and the insulating layer 41 are not shown.

On the back gate BG, the insulating layers (second layers) 40 and the electrode layers (first layers) WL are alternately and repeatedly stacked. Further, a selection gate SG to be the drain-side selection gates SGD or the source-side selection gates SGS is formed on the uppermost electrode layer WL via the insulating layer 40. Furthermore, the insulating layer 44 is formed on the selection gate SG, and the insulating layer (mask foundation layer) 61 is formed on the insulating layer 44. The stacked body is formed using e.g. CVD (Chemical Vapor Deposition).

The electrode layers WL and the selection gate SG are silicon layers containing an impurity (e.g. boron). The insulating layers 40, 44 are e.g. silicon oxide layers and the insulating layer 61 is e.g. a BSG layer.

After the stacked body shown in FIG. 5A is formed, a plurality of slits 62 are formed in the stacked body as shown in FIG. 5B using RIE (Reactive Ion Etching) method using a mask (not shown).

The slits 62 penetrate the stacked body and reach the sacrifice films 55. The slits 62 extend in the X-direction (the direction orthogonal to the paper surface in FIG. 5B), and separate the stacked body into a plurality of blocks in the Y-direction.

Figure 6A:
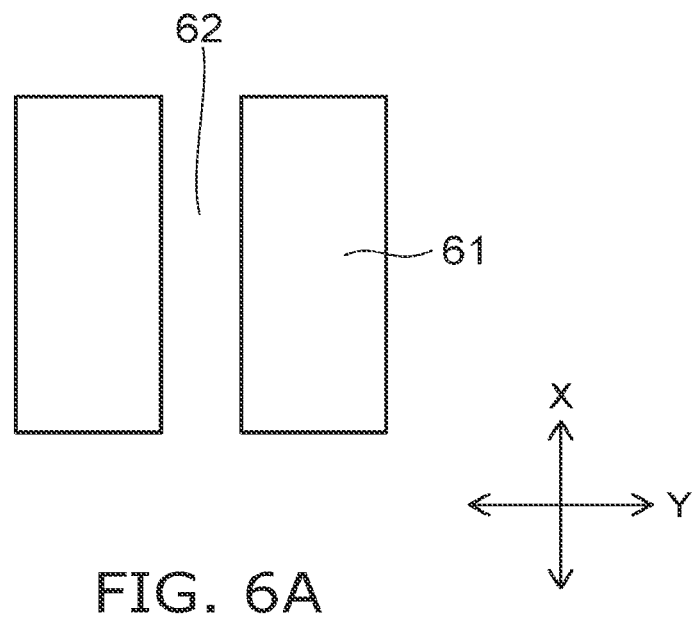
Figure 6B:
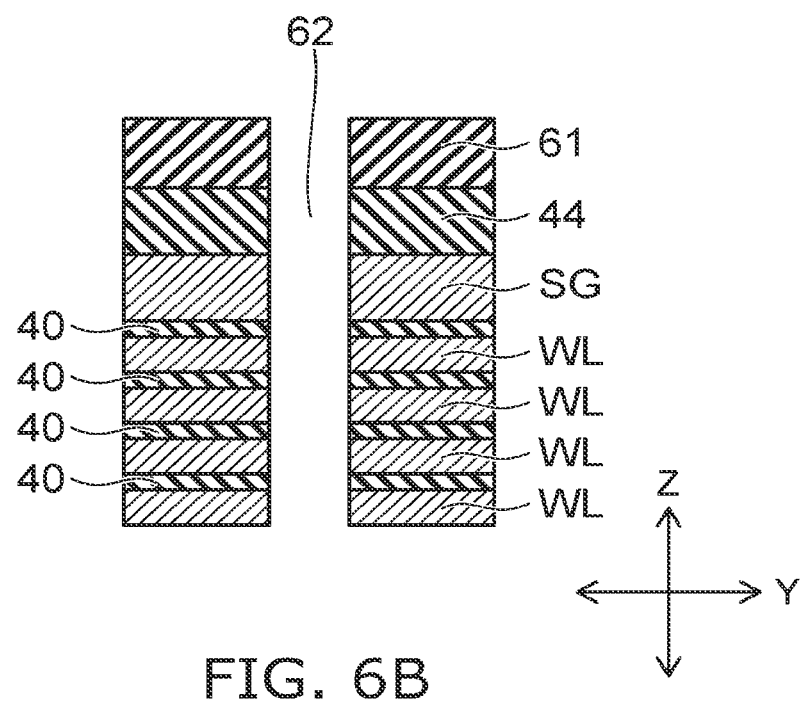

FIG. 6B is a schematic sectional view of a part of the upper layer side of the stacked body with the slit 62 formed therein, and FIG. 6A is a schematic top view of FIG. 6B.

Further, FIG. 7B to FIG. 10B are schematic sectional views showing the processes subsequent to FIG. 6B, and FIGS. 7A to 10A are schematic top views of FIG. 7B to FIG. 10B, respectively.

Figure 7A:
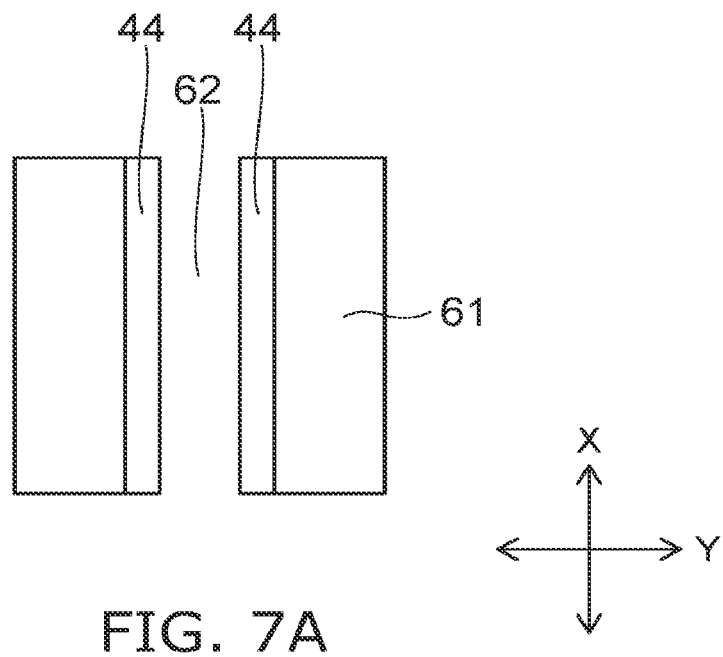
Figure 7B:
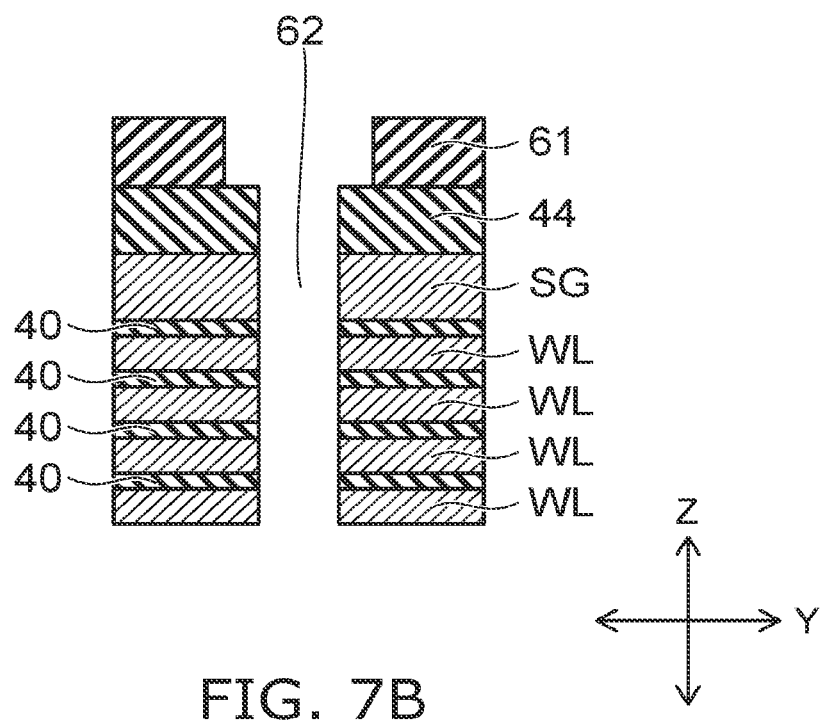

After the slits 62 are formed, the insulating layers (BSG layers) 61 are isotropically etched using e.g. a dilute hydrofluoric acid solution. Thereby, in the insulating layers 61, as shown in FIG. 7B, the side walls contiguous to the slit 62 recede in the Y-direction. Therefore, in the slit 62, the width in the upper portion contiguous to the insulating layer 61 is made larger than the width (the width in the Y-direction) in the lower portion contiguous to the stacked body lower than the insulating layers 61. The steps are formed between the side walls of the insulating layers 61 and the side walls of the insulating layers 44.

Figure 8A:
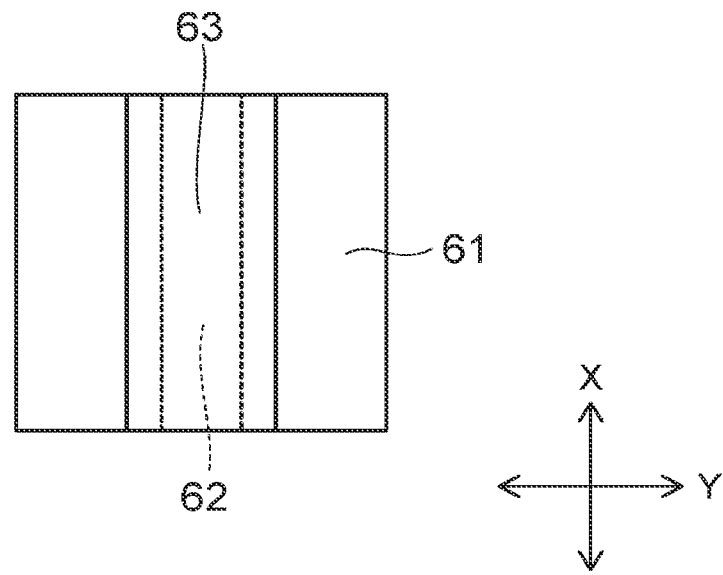
Figure 8B:
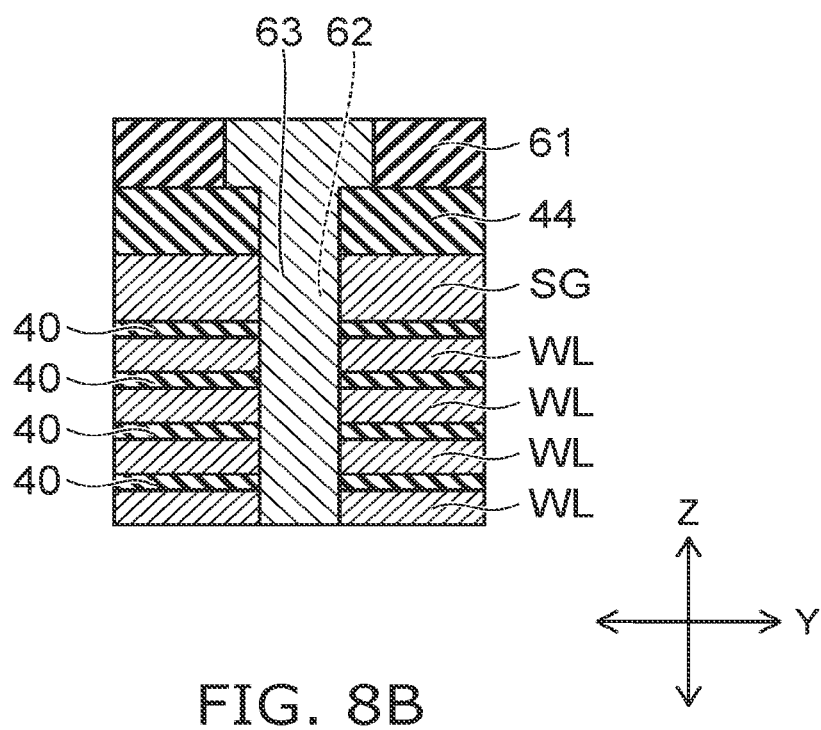

Then, as shown in FIGS. 8A and 8B, a stopper film 63 is buried within the slit 62. The stopper film 63 is formed using a different kind of material from those of the insulating layers 61, 44, 40, the selection gate SG, and the electrode layer WL.

For instance, the stopper film 63 includes a titanium nitride (TIN) film and a tungsten (W) film. First, the titanium nitride film is formed on the side walls of the slit 62 and the tungsten film is buried inside of the film.

Alternatively, as the stopper film 63, e.g. a carbon film may be buried within the slit 62.

After the stopper film 63 is buried within the slit 62, the upper surface is planarized. Then, as shown in FIG. 9B, an intermediate film 64 is formed on the insulating layers 61 and the stopper film 63, and further, a mask layer 65 is formed on the intermediate film 64.

The intermediate film 64 is e.g. a TEOS (Tetraethoxysilane) film.

The mask layer 65 is formed using a different kind of material from those of the insulating layers 61, 44, 40, the selection gate SG, and the electrode layer WL. For instance, the mask layer 65 is a carbon layer. Further, the mask layer 65 is formed using a different kind of material from that of the stopper film 63. Therefore, when carbon is used for the mask layer 65, another material than carbon, e.g., tungsten is desirably used as the stopper film 63. The intermediate film 64 and the insulating layers 61 form a part of the mask layer for formation of the memory holes.

On the mask layer 65, a resist film (not shown) is formed and the resist film is patterned by exposure and development processing on the resist film. Namely, a plurality of holes (openings) are formed in the resist film.

Figure 9A:
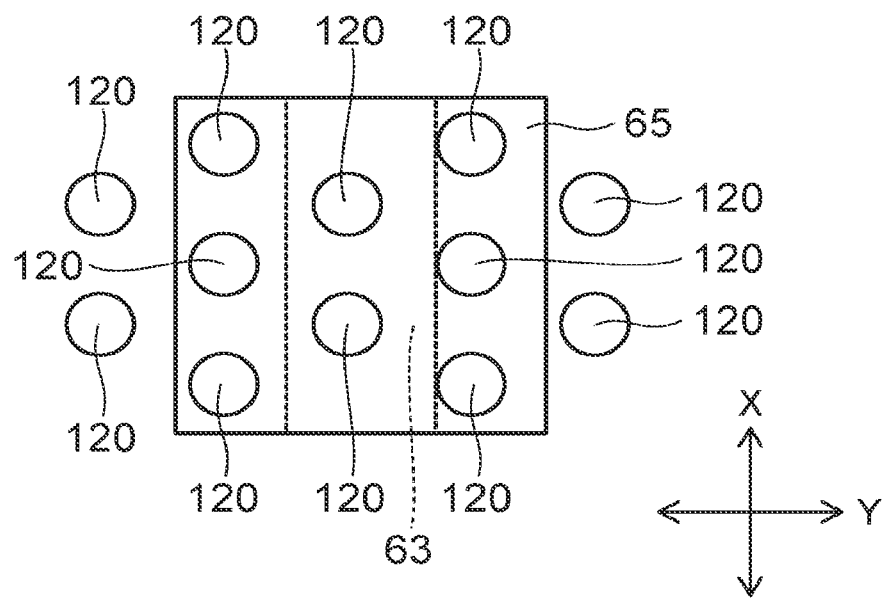
Figure 9B:
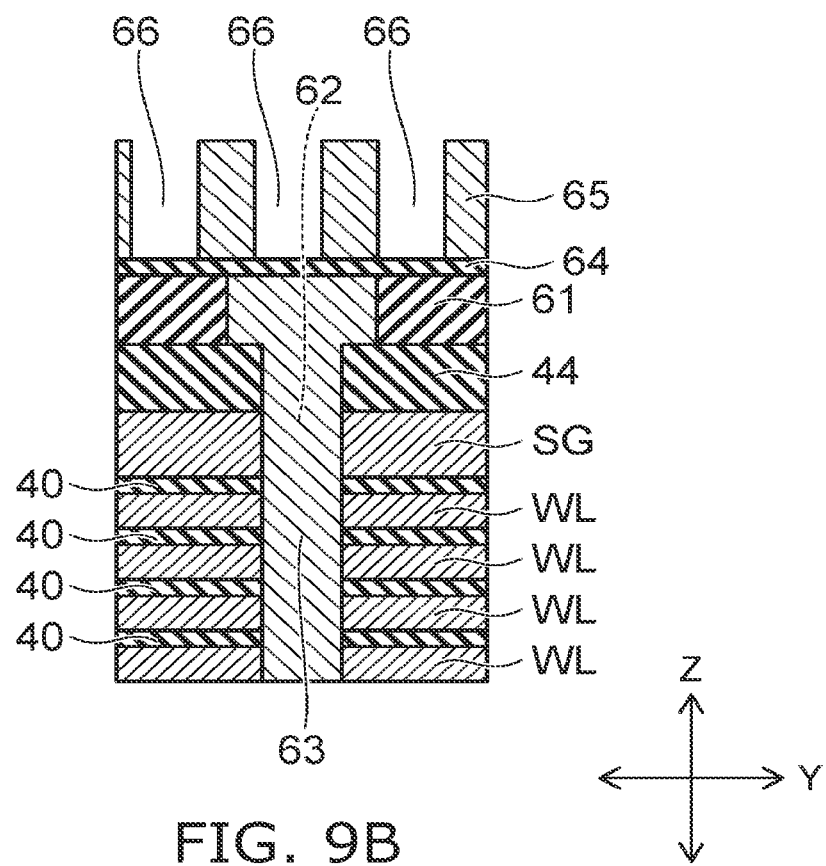

FIG. 9A shows a plurality of holes 120 formed in the resist film on the mask layer 65.

The plurality of holes 120 are regularly arranged with periodicity. For instance, the plurality of holes 120 are arranged in translational symmetry. Further, specifically, the plurality of holes 120 are arranged in a hexagonal close-packed pattern.

The plurality of holes 120 are arranged with equal pitches in the X-direction. Further, the plurality of holes 120 are arranged with equal pitches in the Y-direction. The hole rows adjacent in the Y-direction are different in positions in the X-direction by half pitches from each other. The hole rows adjacent in the X-direction are different in positions in the Y-direction by half pitches from each other. Namely, the plurality of holes 120 are arranged in the so-called staggered arrangement.

The holes 120 form a pattern for formation of the memory holes in the stacked body, which will be described later, and the holes 120 are also formed in positions overlapping on the stopper film 63 as parts in which the memory holes are not formed.

The pattern of the plurality of holes formed in the resist film is transferred to the mask layer 65. That is, a plurality of mask holes 66 are formed in the mask layer 65 by e.g. RIE method using the resist film with the holes 120 formed therein as a mask. In this regard, the intermediate film 64 functions as an etching stopper.

The planar arrangement pattern of the mask holes 66 corresponds to the planar arrangement pattern of the holes 120 of the resist film. Therefore, as shown in FIG. 9B, the mask holes 66 are also formed in positions overlapping on the stopper film 63.

Figure 10A:
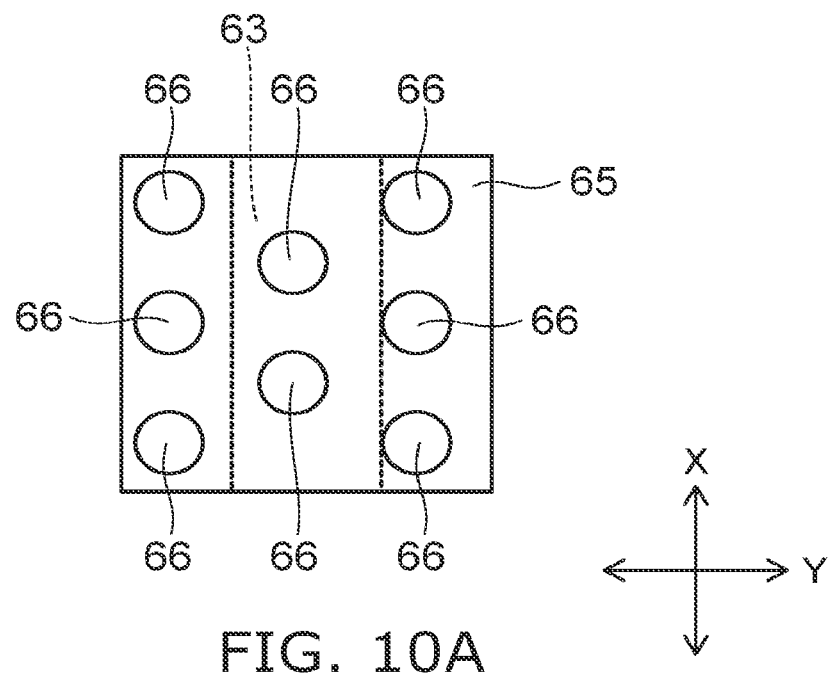
Figure 10B:
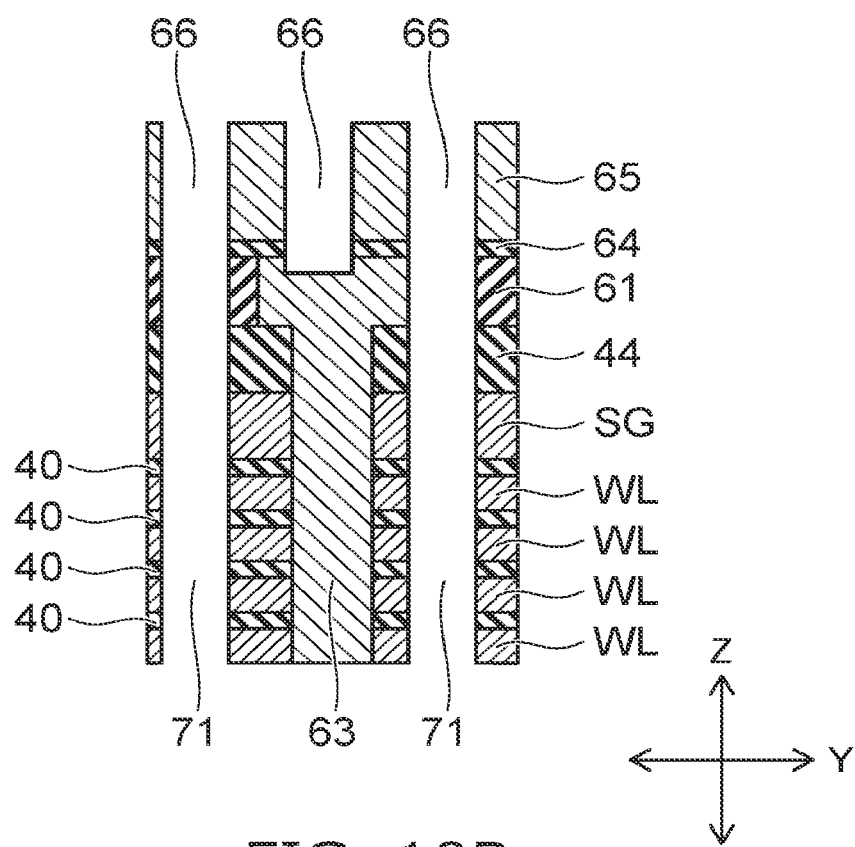

Then, the stacked body is processed by e.g. RIE method using the mask layer 65 as a mask. As shown in FIG. 10B, holes 71 are formed in the stacked body including the selection gate SG and the plurality of electrode layers WL.

In this regard, the stopper film 63 formed using the different kind of material from that of the stacked body functions as an etching stopper. Accordingly, no holes are formed under the mask holes 66 located on the stopper film 63.

Therefore, the planar arrangement pattern of the plurality of holes 71 corresponds to a pattern formed by removal of the hole rows arranged in the X-direction on the slit (stopper film 63) in the hexagonal close-packed pattern of the mask holes 66 (the holes 120 in the resist film).

Figure 11A:
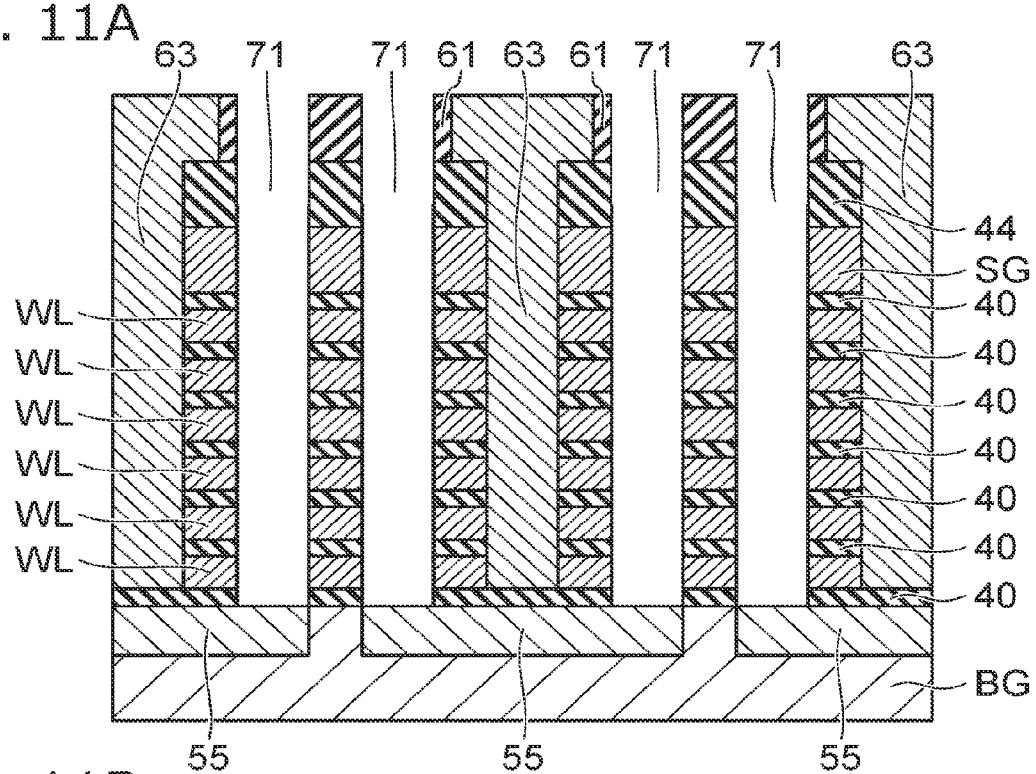

As shown in FIG. 11A, the holes 71 reach the sacrifice films 55 buried in the back gate BG.

After the holes 71 are formed, the sacrifice films 55 are removed by etching through the holes 71. The sacrifice films 55 are removed by e.g. wet etching.

Figure 11B:
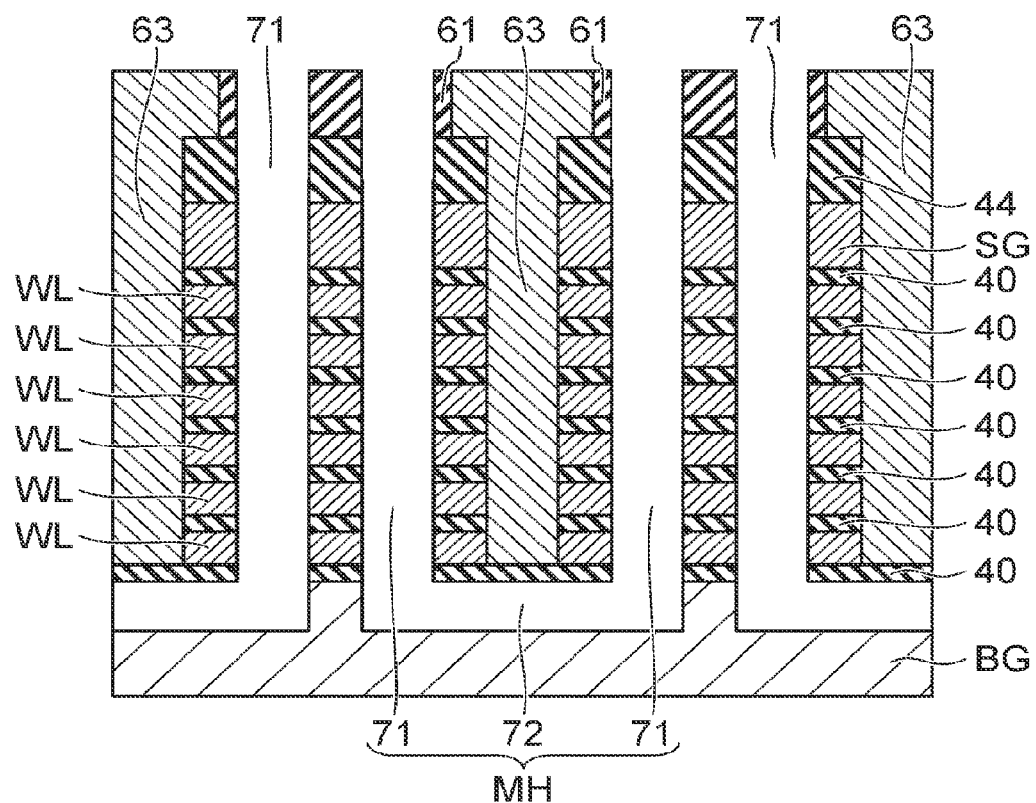

By the removal of the sacrifice films 55, as shown in FIG. 11B, concave portions 72 formed in the back gate BG appear. One concave portion 72 connects one pair of holes 71. Namely, the respective lower ends of the pair of holes 71 connect to one common concave portion 72, and thereby, the U-shaped memory hole MH is formed.

Figure 12A:
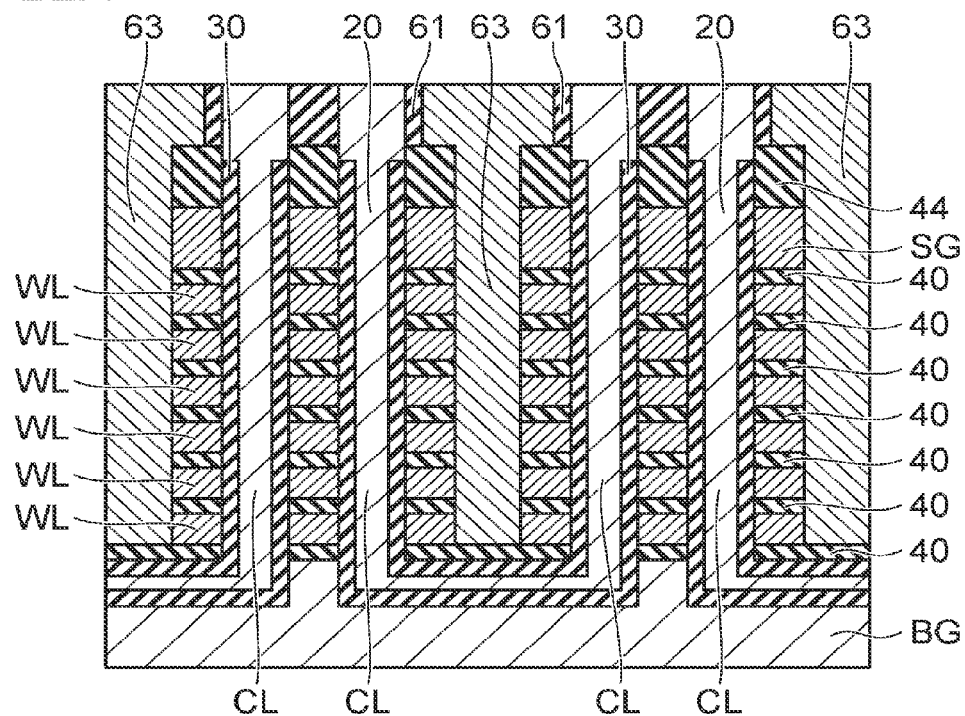

As shown in FIG. 12A, the memory films 30 and the channel bodies 20 are formed within the memory holes MH. Further, the core insulating film 50 shown in FIG. 3 is formed inside of the channel body 20, however, the film is not shown in FIG. 12A.

Figure 12B:
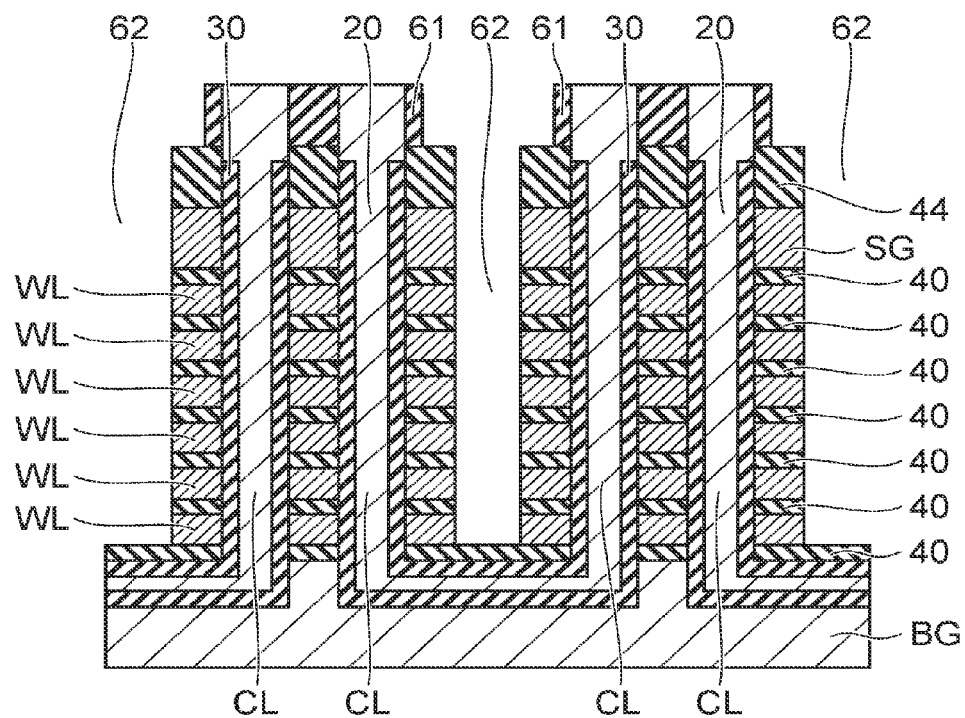
Figure 13A:
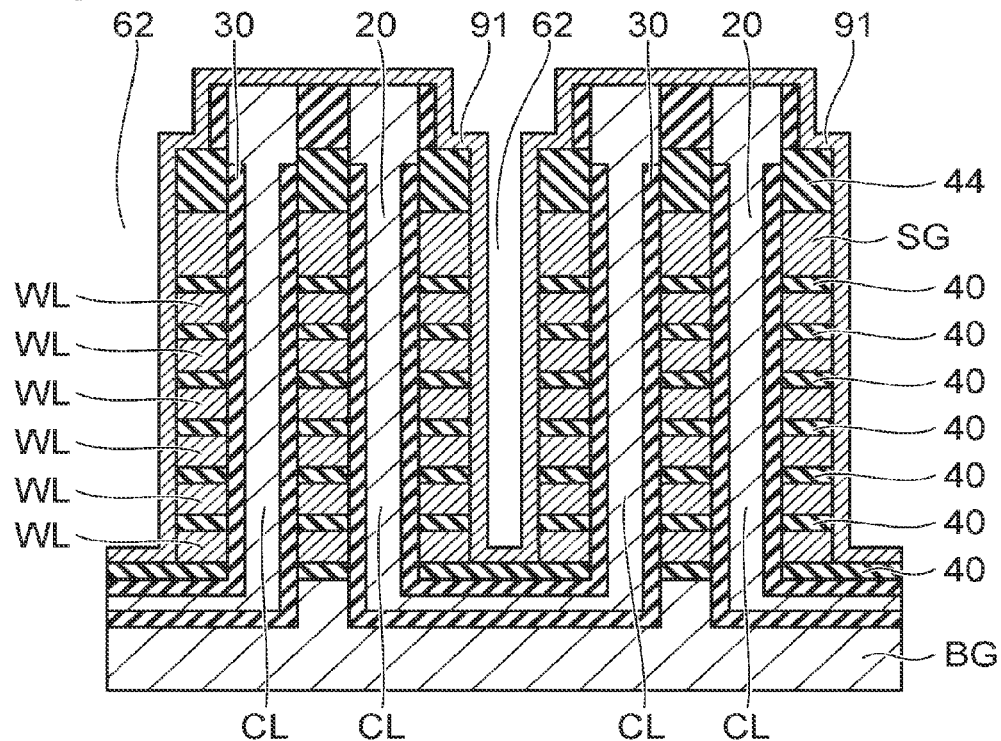

Then, the stopper films 63 are removed. By the removal of the stopper films 63, as shown in FIG. 12B, the slits 62 appear. As shown in FIG. 13A, a metal film 91 is formed on the inner walls (side walls and bottom walls) of the slits 62. The metal film 91 is e.g. a nickel film. The metal film 91 is also formed on the silicon films in the upper end portions of the columnar parts CL.

Figure 13B:
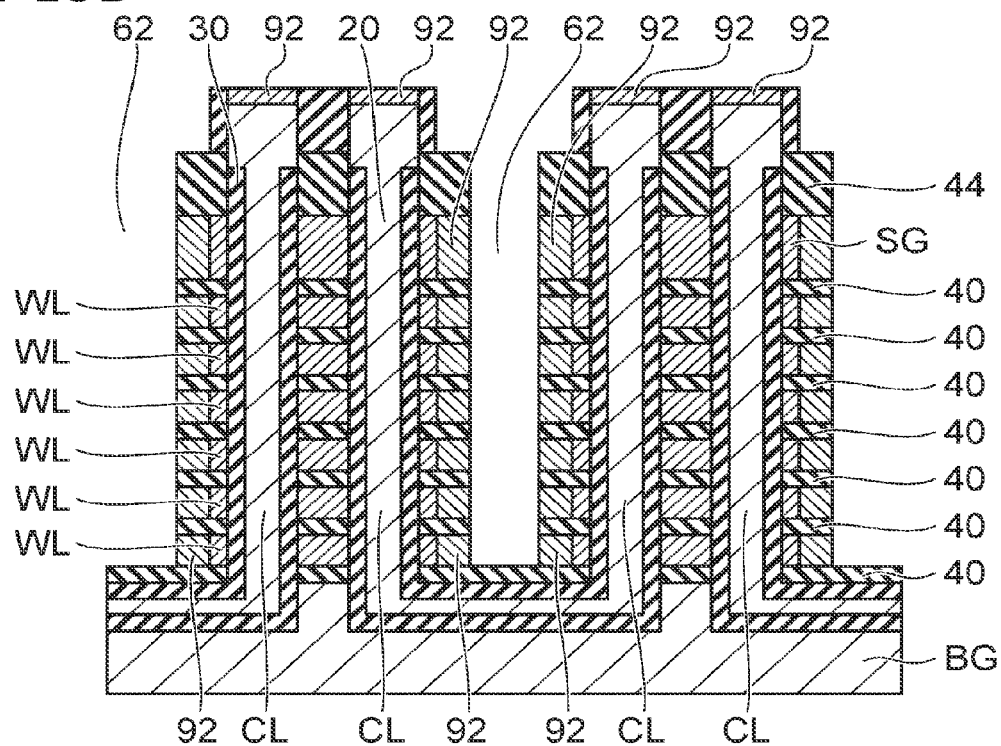

Then, the silicon in contact with the metal film 91 is metal-silicided by heat treatment. Namely, as shown in FIG. 13B, metal silicides 92 are formed in the parts contiguous to the slits 62 on the electrode layers WL and the selection gates SG. Further, the metal silicides 92 are also formed on the silicon films in the upper end portions of the columnar parts CL.

The metal silicide reaction is progressed to the electrode layers WL from the slit 62 side, and thereby, the resistance of the plurality of electrode layers WL may be collectively made lower and the faster operation of the semiconductor memory device may be realized at low cost.

After the metal silicides 92 are formed, the unreacted metal is removed and the insulating isolation films 46 shown in FIG. 2 are buried within the slits 62. The insulating isolation film 46 is e.g. a silicon nitride film.

Then, the source line SL and the bit lines BL shown in FIG. 1 are formed.

For instance, in the configuration in which the plurality of columnar parts CL (hole 71) are arranged in a square lattice in the X-direction and the Y-direction, with miniaturization of design, the distance between the slit 62 and the columnar part CL is shorter, and it may be harder to form sufficient amounts of metal silicides in the electrode layers WL. In order to solve the problem, a staggered arrangement cell is proposed.

Figure 4:
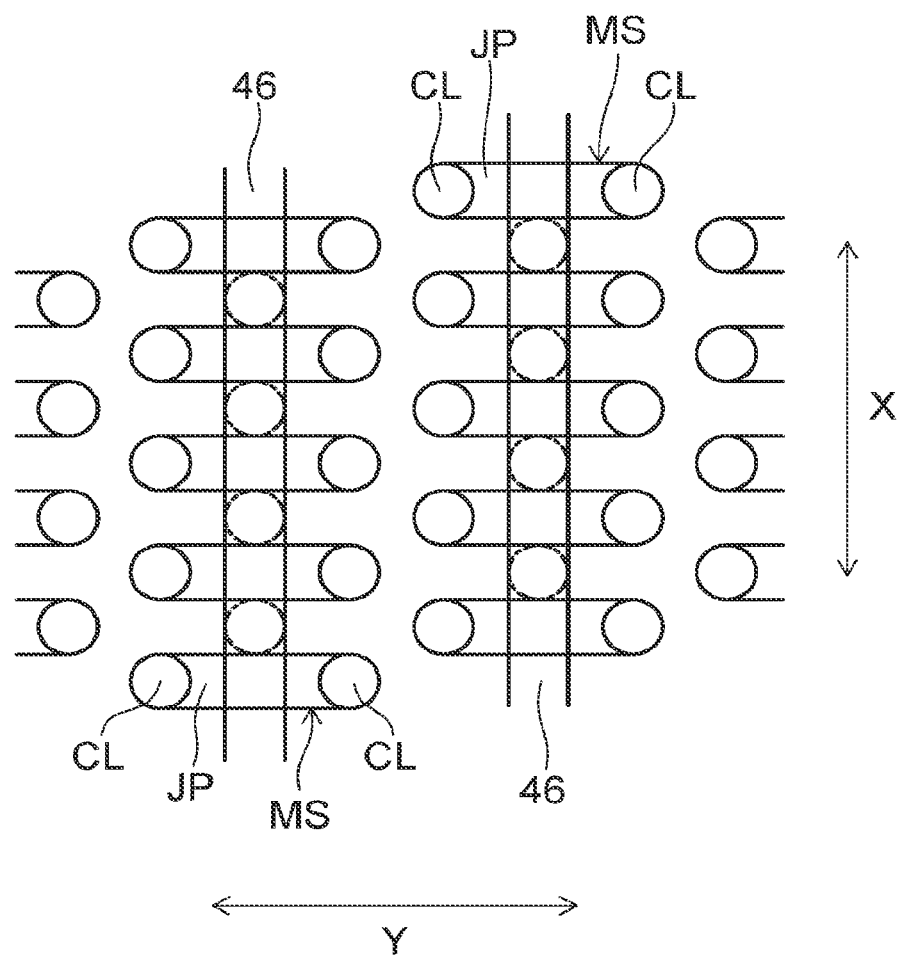
FIG. 4 is a schematic planar view of the memory cell of the first embodiment.

FIG. 4 is a schematic view showing a planar arrangement of the plurality of columnar parts CL in the semiconductor memory device of the first embodiment.

The pair of columnar parts CL sandwiching the common insulating isolation film 46 (slit 62) in the Y-direction are different in the positions in the X-direction by half pitches with respect to the columnar parts CL of the adjacent memory strings MS. In the positions between the columnar parts CL adjacent in the X-direction, the columnar parts CL adjacent in the Y-directions are located.

In the staggered arrangement cell, the distance between the slit 62 and the columnar part CL can be made larger than that of the square lattice arrangement cell according to the same design rule, and the metal-silicided regions of the electrode layers WL are increased and the resistance of the electrode layers WL is easily reduced.

Using the mask in which the holes shown by solid circles in FIG. 4 are formed, the holes 71 for the columnar parts CL in the staggered arrangement may be formed.

However, when the number of stacked layers of the electrode layers WL increases and the aspect ratios of the holes 71 are higher with increase of memory capacity, using the hole pattern with lower uniformity as shown by the solid circles in FIG. 4, at RIE processing of the mask layer, erosion asymmetrically occurs depending on the hole intervals (hole density), and it is concerned that formation of the holes 71 having higher roundness and uniform sizes in the stacking direction is harder.

For instance, in the region in which holes are sparse, the etching rate tends to be higher than that in the region in which holes are relatively dense. Further, if there are sparse and dense regions in the latent pattern exposed and transferred to the resist film, deformation in shape and size may occur in the transferred latent holes.

According to the embodiment, at the stage of the mask pattern, a hole pattern is also formed in the positions shown by dashed-dotted lines in FIG. 4. Namely, as shown in the above described FIG. 9A, the holes 120 are also formed on the slits 62 (stopper films 63) in the resist film and, further, as shown in FIG. 9B, the mask holes 66 are also formed on the slits 62 (stopper films 63) in the mask layer 65.

Accordingly, the mask holes 120, 66 are uniformly arranged without sparse and dense regions, and deformation of the shapes and the sizes of the latent pattern of the resist film and the shapes and the sizes of the mask holes 66 may be suppressed. Therefore, by RIE using the mask layer 65, the holes 71 having higher roundness and less variations in diameter in the stacking direction may be formed in the stacked body.

The mask holes 66 formed on the slits 62 are not transferred to the stacked body because the stopper films 63 serve as etching stoppers.

As described above, according to the embodiment, the process margin for formation of the memory holes is significantly improved, and the highly-reliable semiconductor memory device that can operate faster may be provided. Further, the number of lithography processes at high cost is not increased and the increase of the process cost is minimized. Thereby, an inexpensive semiconductor memory is realized.

Even when the diameter of the hole 71 is larger compared to the width of the slit 62 and when the mask holes 120, 66 are misaligned with respect to the slits 62, transfer of the hole pattern to the slit 62 formation positions may be reliably prevented because the width of the upper portion of the stopper film 63 is larger than that of the lower portion, and the yield is improved. The width of the upper portion of the slit 62 (the upper portion of the stopper film 63) in the Y-direction is larger than the diameters of the mask holes 120, 66.

Further, after the stopper films 63 within the slits 62 are removed, as shown in FIG. 13A, at the process of forming the metal films 91 on the side walls of the slits 62, the metal films 91 of e.g. nickel or the like is easily formed by CVD method with higher coatability because the width of the upper portion of the slit 62 is larger than that of the lower portion.

Furthermore, at RIE of the holes 71, if the side walls of the holes 71 have tapered shapes or bowing shapes, the hole diameters are larger at the upper layer side of the stacked body, the distances to the slits 62 are smaller, and thereby, it may be impossible to form the sufficient amounts of metal silicides in the silicon layers (selection gates SG, electrode layers WL) at the upper layer side.

However, according to the embodiment, by the upper portions expanded in the Y-direction in the stopper films 63, broadening of the holes 71 toward the slits 62 (stopper films 63) more than necessary may be suppressed. Therefore, in the holes 71, the outer shapes of the parts adjacent to the stopper films 63 may be shapes with parts of arcs linearly lost. The broadening of the holes 71 more than necessary at the upper layer side is restricted by the stopper films 63, and thereby, sufficient metal-silicided regions may be secured in the electrode layers WL. Further, the differences between upper and lower diameters of the holes 71 are smaller, and that contributes to realization of a faster, highly-reliable, and high-yield semiconductor memory.

Next, FIGS. 14A to 18B are schematic views showing another method for manufacturing the semiconductor memory device of the first embodiment.

Figure 14A:
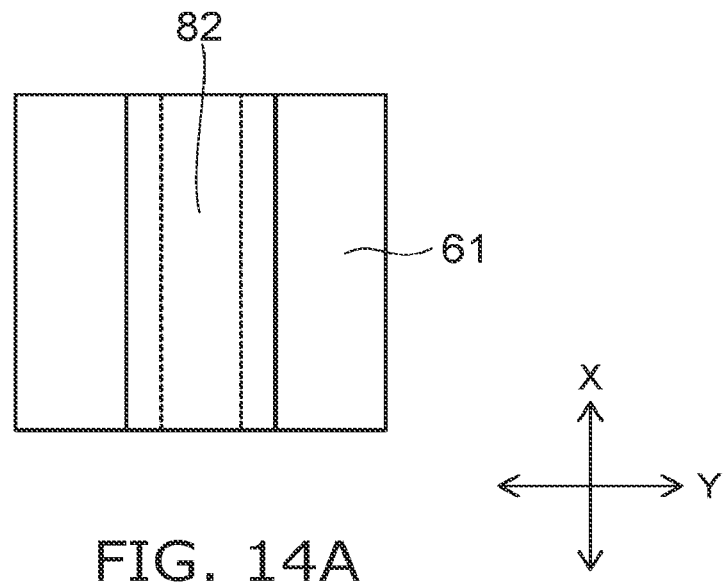
Figure 14B:
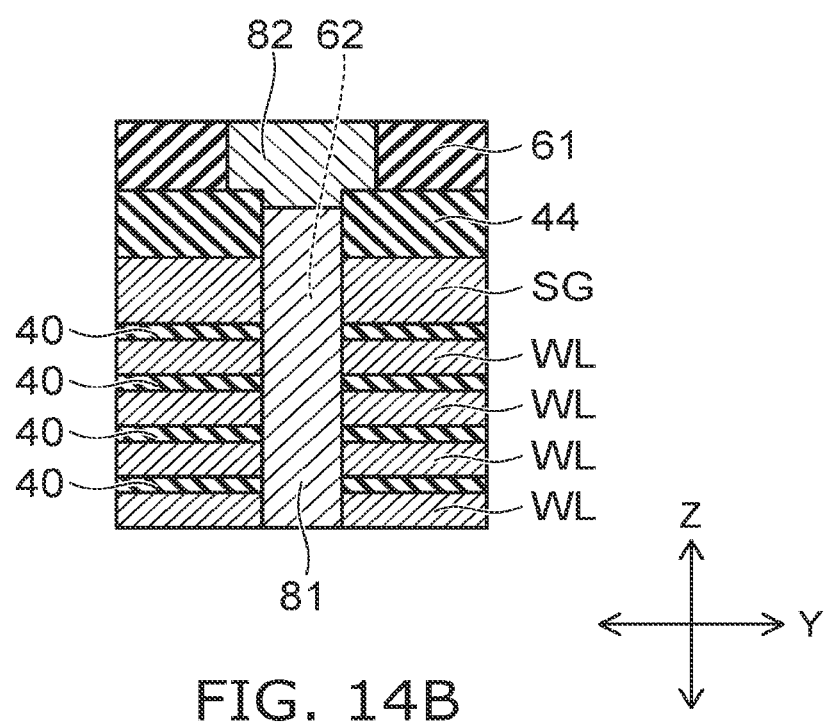

The processes of forming the slit 62 in the stacked body and expanding the width of the upper portion of the slit 62 by isotropic etching of the insulating layer 61 by wet etching and the previous processes are performed in the same manner as those of the above described embodiment. Then, after the slit 62 is formed, as shown in FIG. 14B, two kinds of stopper films 81, 82 are buried within the slit 62.

First, the first film 81 is buried within the slit 62. The first film 81 is formed using a different kind of material from those of the insulating layers 61, 44, 40, the selection gate SG, and the electrode layer WL, e.g., a silicon nitride film. Then, the first film 81 is etched back. The upper surface of the first film 81 is receded to the height contiguous to the insulating layers 44.

After the first film 81 is etched back, the second film 82 is buried in the upper portion of the slit 62. The second film 82 is buried in the upper portion having the larger width than that of the lower portion in the slit 62. The second film 82 is formed using a different kind of material from those of the insulating layers 61, 44, 40, the selection gate SG, the electrode layer WL, and the first film 81. For instance, the second film 82 is a tungsten film or carbon film.

Figure 15A:
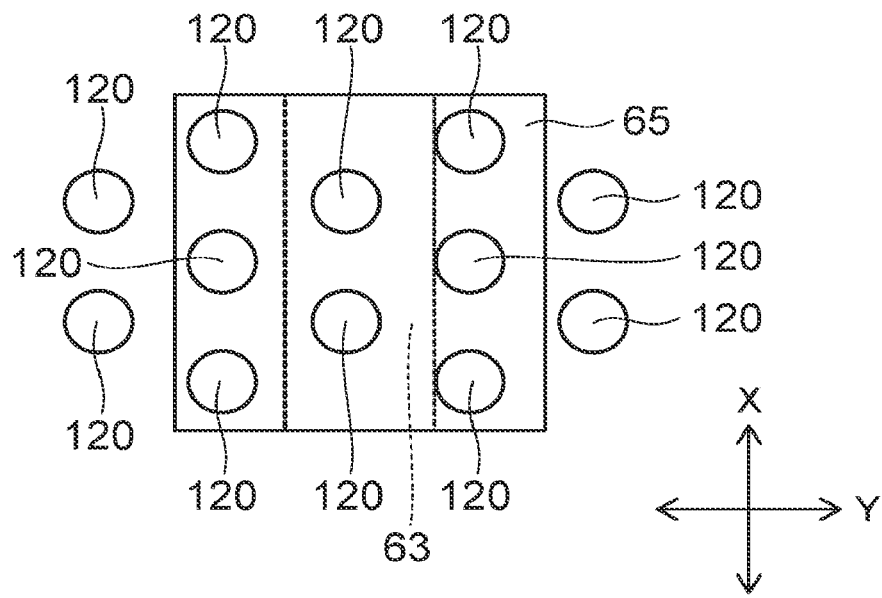
Figure 15B:
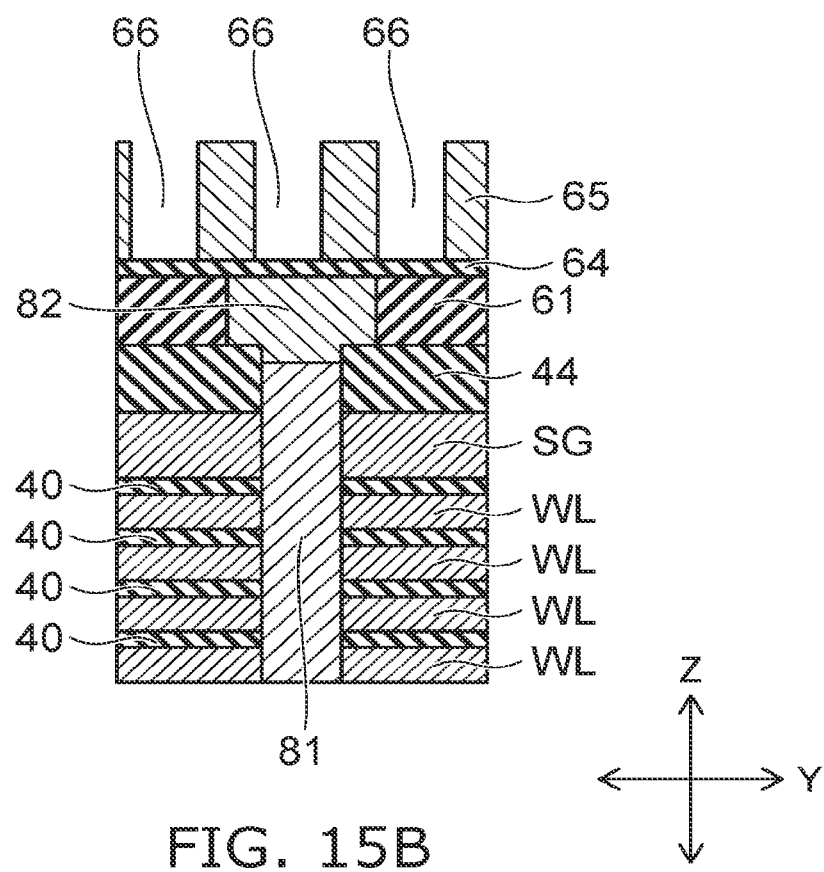
Figure 16A:
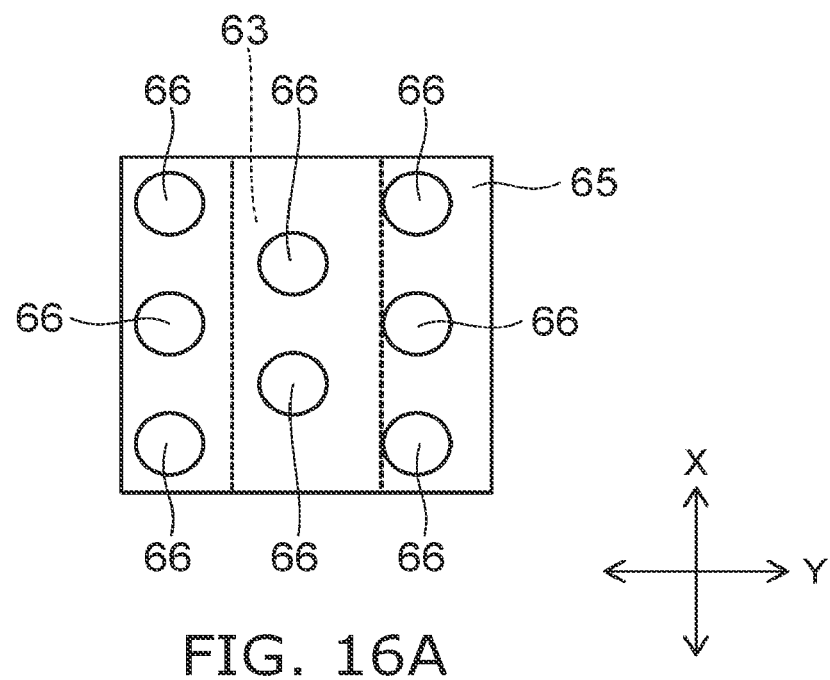
Figure 16B:
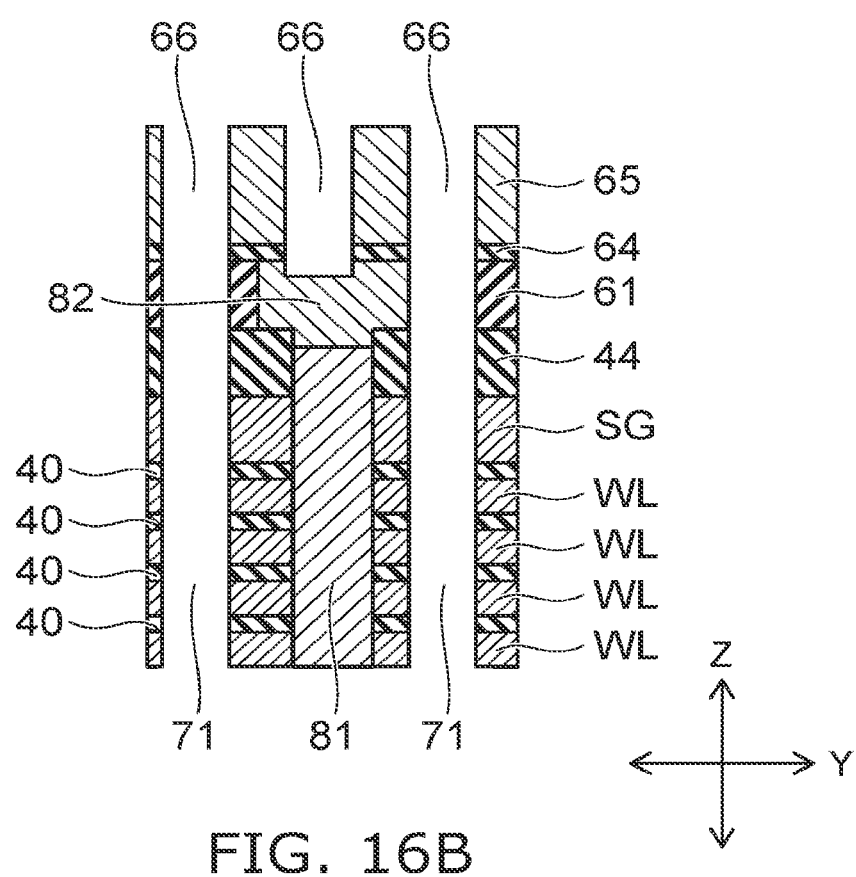

After the stopper films 81, 82 are buried within the slit 62, the upper surface is planarized. Subsequently, the processes shown in FIGS. 15B and 16B are continued. FIGS. 15B and 16B correspond to the section of FIG. 14B. FIGS. 15A and 16A correspond to the top views of FIGS. 15B and 16B, respectively.

As shown in FIG. 15B, the intermediate film 64 is formed on the insulating layers 61 and the stopper film 82, and further, the mask layer 65 is formed on the intermediate film 64.

The intermediate film 64 is e.g. a film having a major component of silicon oxide deposited using TEOS.

The mask layer 65 is formed using a different kind of material from those of the insulating layers 61, 44, 40, the selection gate SG, and the electrode layer WL. For instance, the mask layer 65 is a carbon layer. Further, the mask layer 65 is formed using a different kind of material from that of the stopper film 82. Therefore, when carbon is used for the mask layer 65, another material than carbon, e.g., tungsten is desirably used for the stopper film 82.

On the mask layer 65, a resist film (not shown) is formed and the resist film is patterned by exposure and development processing on the resist film. Namely, a plurality of holes (openings) are formed in the resist film.

FIG. 15A shows the plurality of holes 120 formed in the resist film on the mask layer 65. Also, in the specific example, the plurality of holes 120 are regularly arranged with periodicity. For instance, the plurality of holes 120 are arranged in translational symmetry. Further, specifically, the plurality of holes 120 are arranged in a hexagonal close-packed pattern. Namely, the plurality of holes 120 are arranged in the so-called staggered arrangement. The holes 120 are also formed in positions overlapping on the stopper films 81, 82 as parts in which the memory holes are not formed.

The plurality of hole patterns formed in the resist film are transferred to the mask layer 65. That is, the plurality of mask holes 66 are formed in the mask layer 65 by e.g. RIE method using the resist film with the holes 120 formed therein as a mask. In this regard, the intermediate film 64 functions as an etching stopper.

The planar arrangement pattern of the mask holes 66 corresponds to the planar arrangement pattern of the holes 120 of the resist film. Therefore, as shown in FIG. 15B, the mask holes 66 are also formed in positions overlapping on the stopper film 82.

Then, the stacked body is processed by e.g. RIE method using the mask layer 65 as a mask. As shown in FIG. 16B, the holes 71 are formed in the stacked body including the selection gates SG and the plurality of electrode layers WL.

In this regard, the stopper film 82 formed using the different kind of material from that of the stacked body functions as an etching stopper. Accordingly, no holes are formed under the mask holes 66 located on the stopper film 82.

Figure 17A:
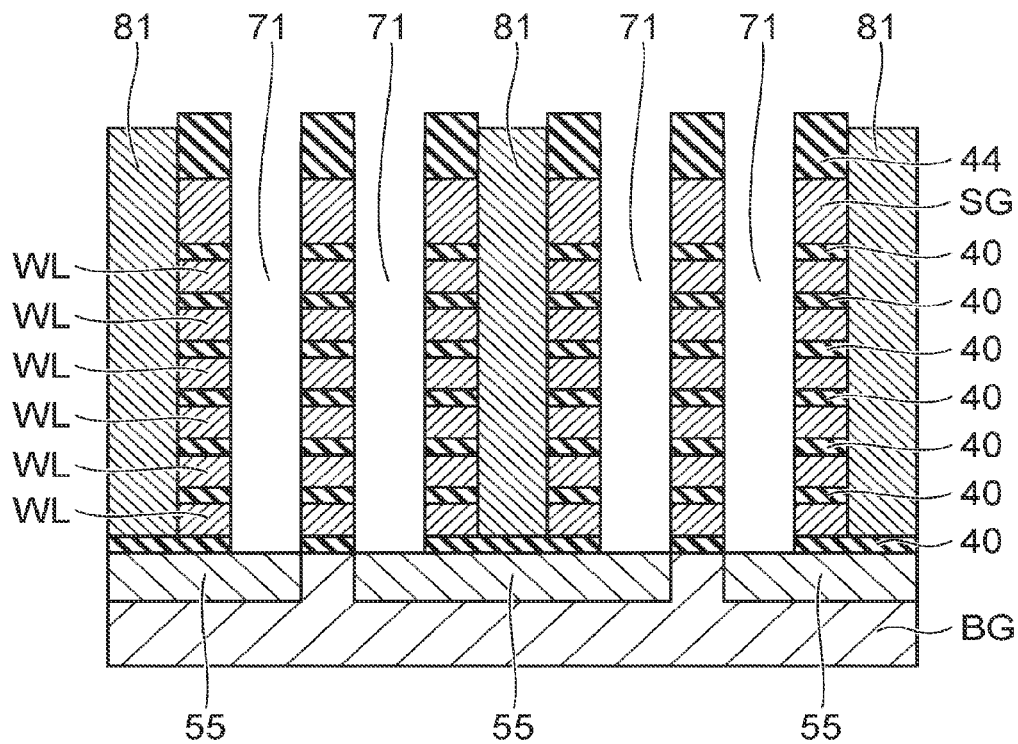

As shown in FIG. 17A, the holes 71 reach the sacrifice films 55 buried in the back gate BG.

After the holes 71 are formed, the second film 82, the insulating layer 61, the intermediate films 64, and the mask layers 65 buried in the upper portion of the slit 62 are removed. As shown in FIG. 17A, the first films 81 are left within the slits 62.

Then, the sacrifice films 55 are removed by etching through the holes 71. The sacrifice films 55 are removed by e.g. wet etching.

By the removal of the sacrifice films 55, like the above described FIG. 11B, the concave portions 72 formed in the back gate BG appear. The respective lower ends of the pair of holes 71 connect to one common concave portion 72, and thereby, the U-shaped memory hole MH is formed.

Figure 17B:
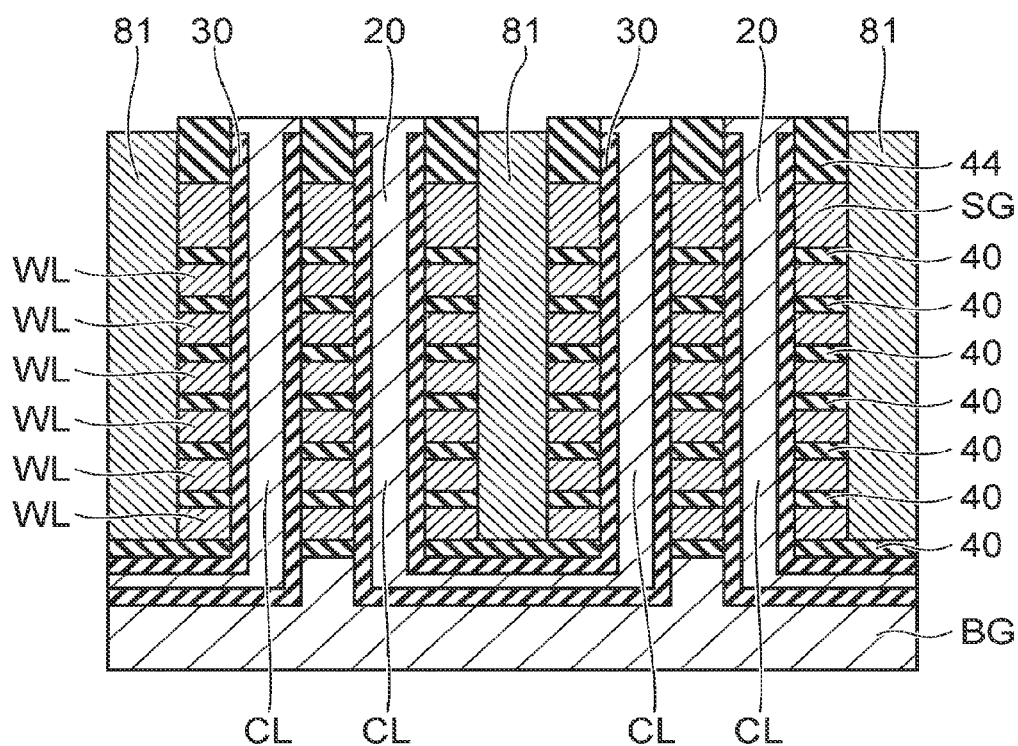

As shown in FIG. 17B, the memory films 30 and the channel bodies 20 are formed within the memory holes MH.

Figure 18A:
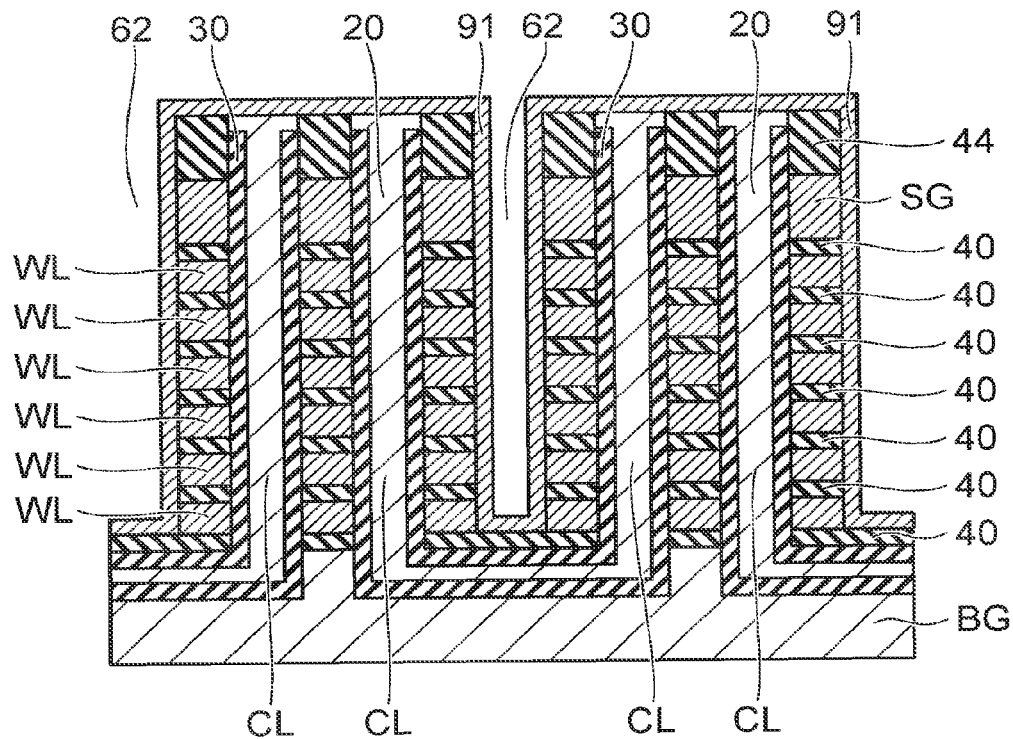

Then, the first films 81 are removed. By the removal of the first films 81, the slits 62 appear. As shown in FIG. 18A, a metal film 91 is formed on the inner walls (side walls and bottom walls) of the slits 62. The metal film 91 is also formed on the silicon films in the upper end portions of the columnar parts CL.

Figure 18B:
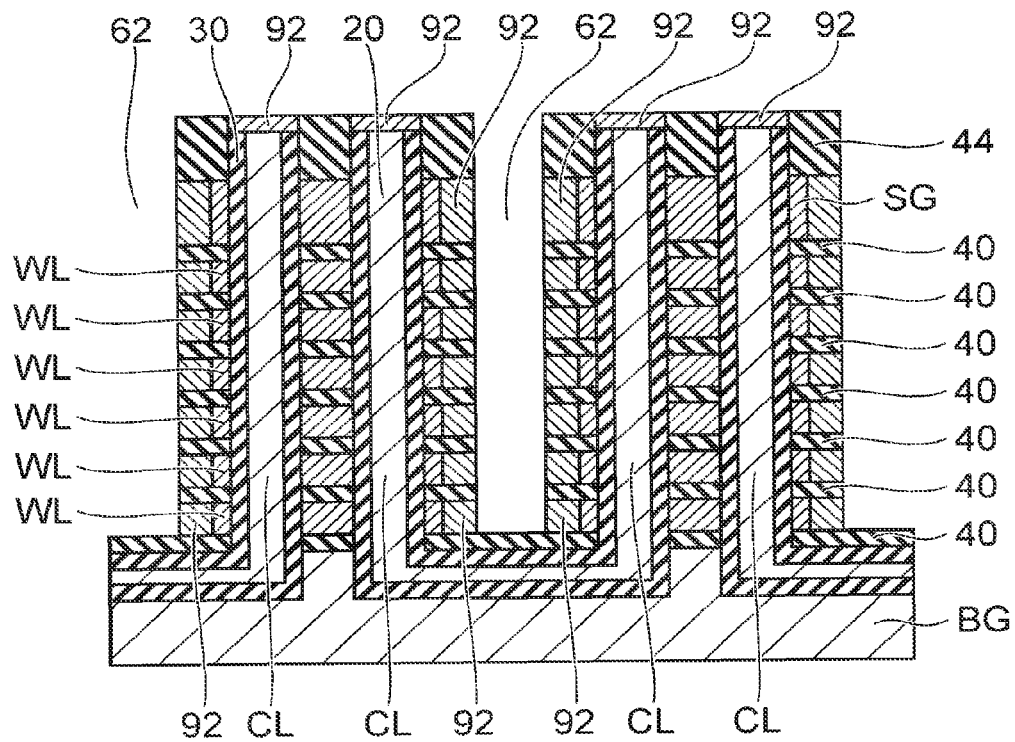

Then, the silicon in contact with the metal film 91 is metal-silicided by heat treatment. Namely, as shown in FIG. 18B, the metal silicides 92 are formed in the parts contiguous to the slits 62 on the electrode layers WL and the selection gates SG. Further, the metal silicides 92 are also formed on the silicon films of the upper end portions of the columnar parts CL.

After the metal silicides 92 are formed, the unreacted metal is removed and the insulating isolation films 46 shown in FIG. 2 are buried within the slits 62. Then, the source line SL and the bit lines BL shown in FIG. 1 are formed.

Also, in the embodiment shown in FIGS. 14A to 18B, at the stage of the mask pattern, the hole pattern is also formed in the positions on the slits 62. Namely, as shown in FIG. 15A, the holes 120 are also formed on the slit 62 (stopper film 82) in the resist film and, further, as shown in FIG. 15B, the mask holes 66 are also formed on the slit 62 (stopper film 82) in the mask layer 65.

Accordingly, the mask holes 120, 66 are uniformly arranged without sparse and dense regions, and deformation of the shapes and the sizes of the latent pattern of the resist film and the shapes and the sizes of the mask holes 66 may be suppressed. Therefore, by RIE using the mask layer 65, the holes 71 having higher roundness and less variations in diameter in the stacking direction may be formed in the stacked body.

The mask holes 66 formed on the slits 62 are not transferred to the stacked body because the stopper film 82 serves as an etching stopper.

Also, in the embodiment, the process margin for formation of the memory holes is significantly improved, and the highly-reliable semiconductor memory device that can operate faster may be provided. Further, the number of lithography processes at high cost is not increased and the increase of the process cost is minimized. Thereby, an inexpensive semiconductor memory is realized.

Even when the diameter of the hole 71 is larger compared to the width of the slit 62 and when the mask holes 120, 66 are misaligned with respect to the slits 62, transfer of the hole pattern to the slit 62 formation positions may be reliably prevented because the width of the second film 82 buried in the upper portion of the slit 62 is expanded, and the yield is improved.

Further, according to the embodiment, the silicon nitride film having higher embedability than tungsten and carbon as the first film 81 is buried within the deep slit 62, and then, the second film 82 that functions as an etching stopper is buried in the upper portion having the expanded width.

Particularly, in the case where the stopper film is deposited by plasma CVD or the like and its step coatability is not higher and in the case where it is concerned that the stacked body is distorted due to formation of the stopper film with higher film stress within the slit 62, the method for separately burying two kinds of films within the slit 62 is effective.

The first film 81 is buried within the slit 62, then etched back, and receded to the vicinity of the boundary between the insulating layers 44 and the insulating layers 61. Then, as the second film 82, e.g. a carbon film is buried in the slit upper portion on the first film 81. Then, after the holes 71 are formed, the mask layer 65 is removed by ashing processing, further the insulating layers 61 (BSG layers) are removed in fluorine vapor, and thereby, as shown in FIG. 17A, the first films 81 within the slits 62 and the upper surface of the stacked body can be leveled to be nearly flat. Therefore, the memory cell array with less steps can be formed and the yield is improved.

Figure 19:
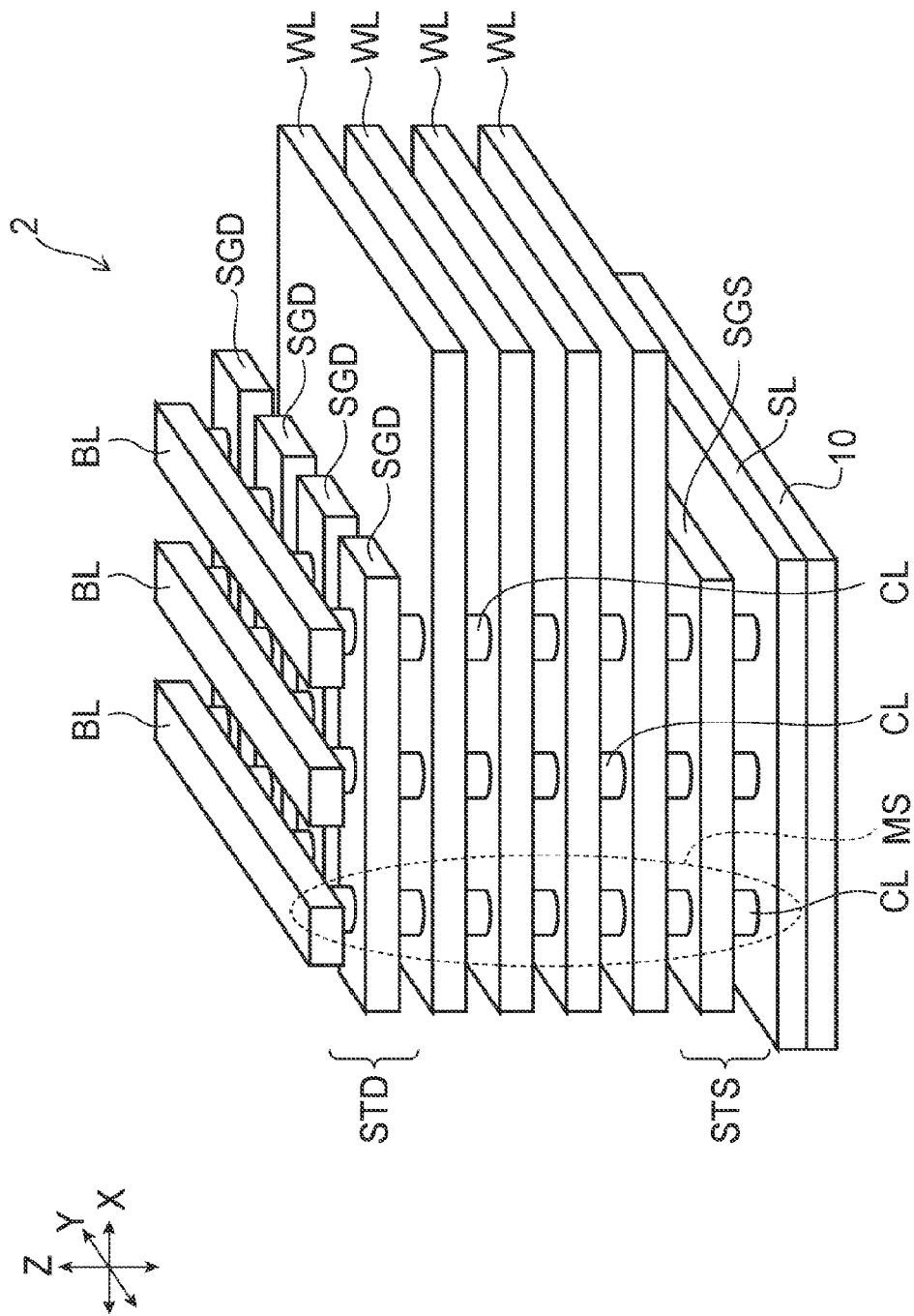
FIG. 19 is a schematic perspective view of a memory cell array of a semiconductor memory device of a second embodiment.

Next, FIG. 19 is a schematic perspective view of a memory cell array 2 of a semiconductor memory device of the second embodiment. Note that, to facilitate visualization, insulating layers etc. are not shown in FIG. 19 like FIG. 1. In FIG. 19, two directions in parallel to a major surface of a substrate 10 and orthogonal to each other are an X-direction and a Y-direction, and a direction orthogonal to both the X-direction and the Y-direction is a Z-direction (stacking direction).

A source layer SL is provided on the substrate 10. A source-side selection gate (lower selection gate) SGS is provided on the source layer SL via an insulating layer.

An insulating layer is provided on the source-side selection gate SGS, and a stacked body in which a plurality of electrode layers WL and a plurality of insulating layers are alternately stacked is provided on the insulating layer.

An insulating layer is provided on the uppermost electrode layer WL and drain-side selection gates (upper selection gates) SGD are provided on the insulating layer.

In the stacked body, the above described columnar parts CL extending in the Z-direction are provided. Namely, the columnar parts CL penetrate the drain-side selection gates SGD, the plurality of electrode layers WL, and the source-side selection gate SGS. Upper ends of channel bodies 20 in the columnar parts CL are connected to bit lines BL and lower ends of the channel bodies 20 are connected to the source line SL.

Also, in the memory cell array 2, for formation of holes corresponding to the columnar parts CL in the stacked body, the above described method may be applied.

Figure 20:
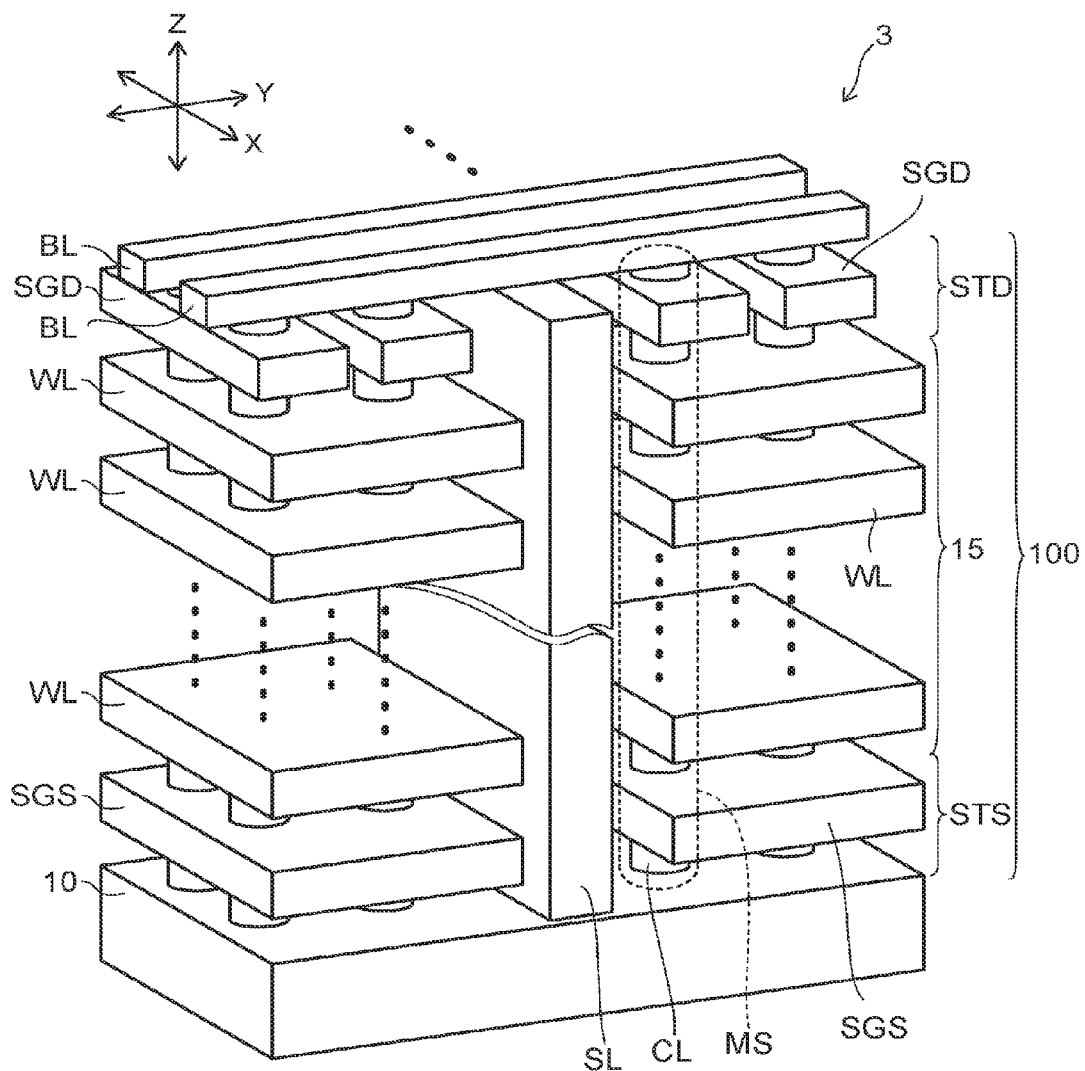
FIG. 20 is a schematic perspective view of a memory cell array of a third embodiment.

FIG. 20 is a schematic perspective view of a memory cell array 3 of the third embodiment. Note that, to facilitate visualization, insulating layers are not shown in FIG. 20.

In FIG. 20, two directions in parallel to a major surface of a substrate 10 and orthogonal to each other are an X-direction (first direction) and a Y-direction (second direction), and a direction orthogonal to both the X-direction and the Y-direction is a Z-direction (third direction, stacking direction).

Source-side selection gates (lower gate layers) SGS are provided on the substrate 10 via an insulating layer. On the source-side selection gates SGS, a stacked body 15 in which electrode layers WL and insulating layers are alternately stacked one by one is provided. An insulating layer 40 is provided between the electrode layer WL and the electrode layer WL as shown in FIG. 3 like the first embodiment.

Drain-side selection gates (upper gate layers) SGD are formed on the uppermost electrode layer WL via an insulating layer.

The source-side selection gates SGS, the drain-side selection gates SGD, and the electrode layers WL are metal layers (e.g. layers mainly containing tungsten). Or, the source-side selection gates SGS, the drain-side selection gates SGD, and the electrode layers WL are e.g. silicon layers containing silicon as a major component, and the silicon layers are doped with e.g. boron as an impurity for providing conductivity. Or, the source-side selection gates SGS, the drain-side selection gates SGD, and the electrode layers WL may contain metal silicide.

On the drain-side selection gates SGD, a plurality of bit lines (metal films) BL are provided via an insulating layer.

The drain-side selection gates SGD are separated into a plurality of pieces in the Y-direction in correspondence with the rows of the plurality of columnar parts CL arranged in the X-direction, and the respective drain-side selection gates SGD extend in the X-direction. The bit lines BL are separated into a plurality of pieces in the X-direction in correspondence with the rows of the plurality of columnar parts CL arranged in the Y-direction, and the respective bit lines BL extend in the Y-direction.

The plurality of columnar parts CL penetrate a stacked body 100 including the source-side selection gates SGS, the stacked body 15 containing the plurality of electrode layers WL, and the drain-side selection gates SGD. The columnar parts CL extend in the stacking direction (Z-direction) of the stacked body 15. The columnar parts CL are formed in e.g. circular cylinder shapes or elliptic cylinder shapes.

The stacked body 100 is separated into a plurality of pieces in the Y-direction. In the separation part, e.g. a source layer SL is provided.

Figure 35:
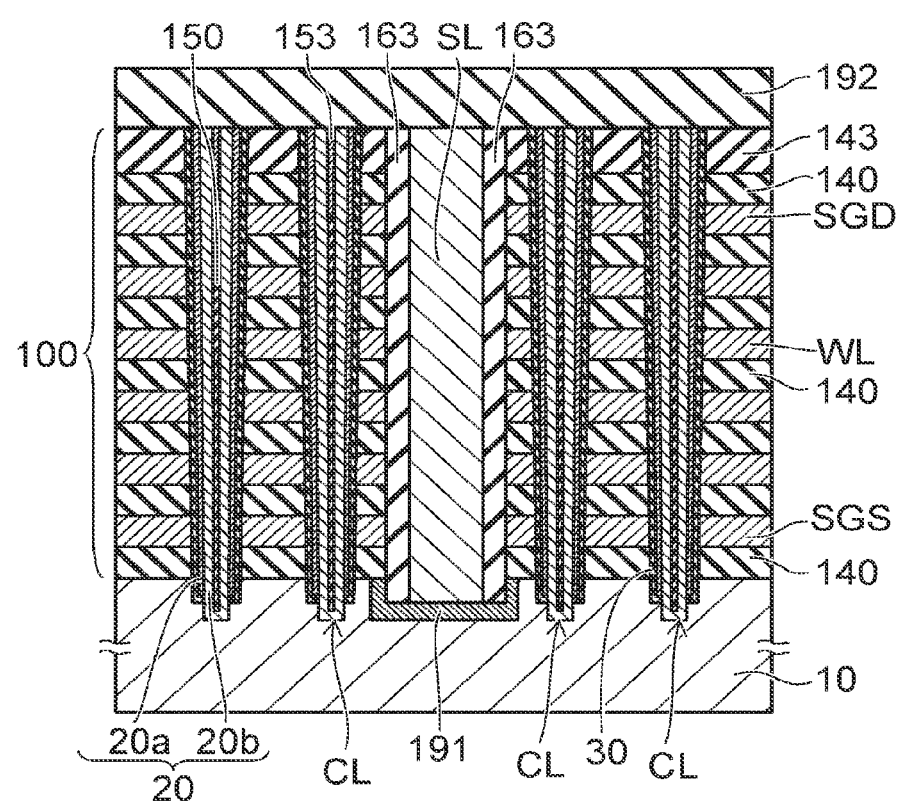

FIG. 35 is a schematic sectional view of the columnar parts CL and the separation part.

The source layer SL contains a metal (e.g. tungsten). The lower end of the source layer SL is connected to the substrate 10. The upper end of the source layer SL is connected to an upper layer interconnection which is not shown in the drawing. As shown in FIG. 35, insulating films 163 are provided between the source layer SL and the electrode layers WL, between the source layer SL and the source-side selection gates SGS, and between the source layer SL and the drain-side selection gates SGD.

The columnar parts CL are formed within memory holes 171 (shown in FIG. 23B) formed in the stacked body 100. Within the memory holes, as shown in FIG. 35, channel films (channel bodies) 20 are provided. The channel films 20 are silicon films containing e.g. silicon as a major component. The channel films 20 do not substantially contain any impurity.

The channel films 20 are formed in tubular shapes extending in the stacking direction of the stacked body 100. The upper end portions of the channel films 20 penetrate the drain-side selection gates SGD and are connected to the bit lines BL shown in FIG. 20.

The lower end portions of the channel films 20 penetrate the source-side selection gates SGS and are connected to the substrate 10. The lower ends of the channel films 20 are electrically connected to the source layer SL via the substrate 10.

A memory film 30 is provided between the side wall of the memory hole and the channel film 20. The memory film 30 has a block insulating film 35, a charge storage film 32, and a tunnel insulating film 31 like the first embodiment shown in FIG. 3. The memory film 30 is formed in a tubular shape extending in the stacking direction of the stacked body 100.

Between the electrode layers WL and the channel film 20, the block insulating film 35, the charge storage film 32, and the tunnel insulating film 31 are sequentially provided from the electrode layer WL side. The block insulating film 35 is in contact with the electrode layers WL, the tunnel insulating film is in contact with the channel film 20, and the charge storage film 32 is provided between the block insulating film 35 and the tunnel insulating film 31.

The memory film 30 surrounds the outer circumference of the channel film 20. The electrode layers WL surround the outer circumference of the channel film 20 via the memory film 30. A core insulating film 50 is provided inside of the channel film 20.

Memory cells having vertical transistor structures in which control gates surround the channel film 20 are formed in intersection parts between the channel film 20 and the respective electrode layers WL.

Also, the semiconductor memory device of the third embodiment is a nonvolatile semiconductor memory device that may electrically freely erase and write data and hold memory contents after power is turned off.

As shown in FIG. 20, a drain-side selection transistor STD is provided in the upper end portion of the columnar part CL and a source-side selection transistor STS is provided in the lower end portion.

The memory cell, the drain-side selection transistor STD, and the source-side selection transistor STS are vertical transistors in which currents flow in the stacking direction (Z-direction) of the stacked body 100.

The drain-side selection gate SGD functions as a gate electrode (control gate) of the drain-side selection transistor STD. Between the drain-side selection gate SGD and the channel film 20, an insulating film functioning as a gate insulating film of the drain-side selection transistor STD is provided.

The source-side selection gate SGS functions as a gate electrode (control gate) of the source-side selection transistor STS. Between the source-side selection gate SGS and the channel film 20, an insulating film functioning as a gate insulating film of the source-side selection transistor STS is provided.

Between the drain-side selection transistor STD and the source-side selection transistor STS, the plurality of memory cells with the respective electrode layers WL as the control gates are provided. Those plurality of memory cells, drain-side selection transistor STD, and source-side selection transistor STS are series-connected through the channel film 20 and form one memory string MS. A plurality of the memory strings MS are arranged in the X-direction and the Y-direction, and thereby, the plurality of memory cells are three-dimensionally provided in the X-direction, the Y-direction, and the Z-direction.

FIGS. 21 to 23B are schematic views showing a method for forming memory holes of the semiconductor memory device of the third embodiment.

Figure 21:
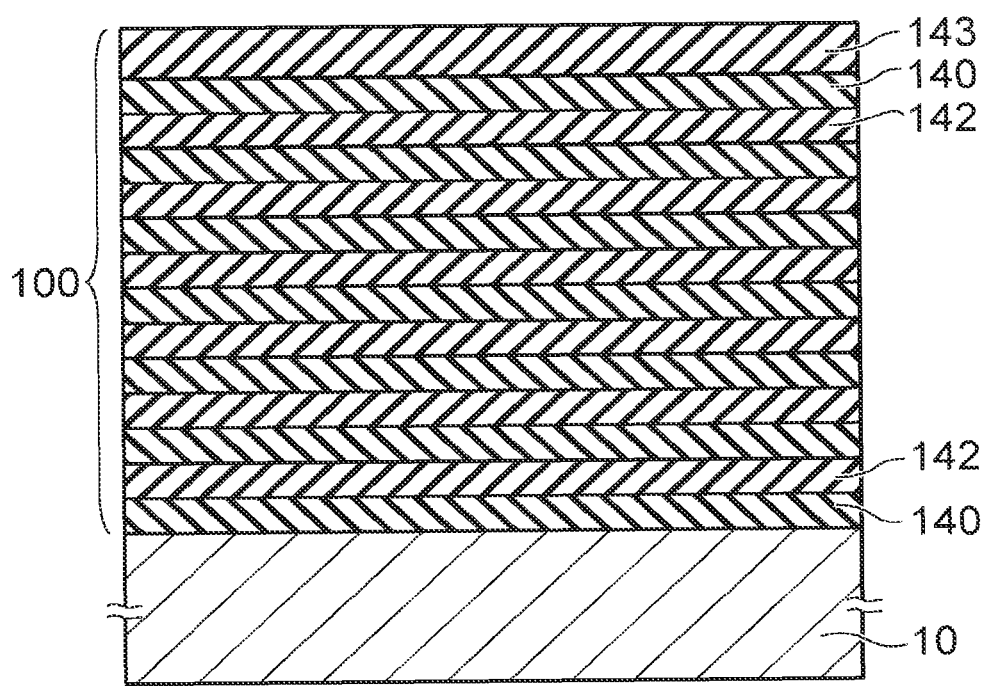
FIG. 21 is a schematic sectional view showing a method for forming the semiconductor memory device of the third embodiment.
Figure 22A:
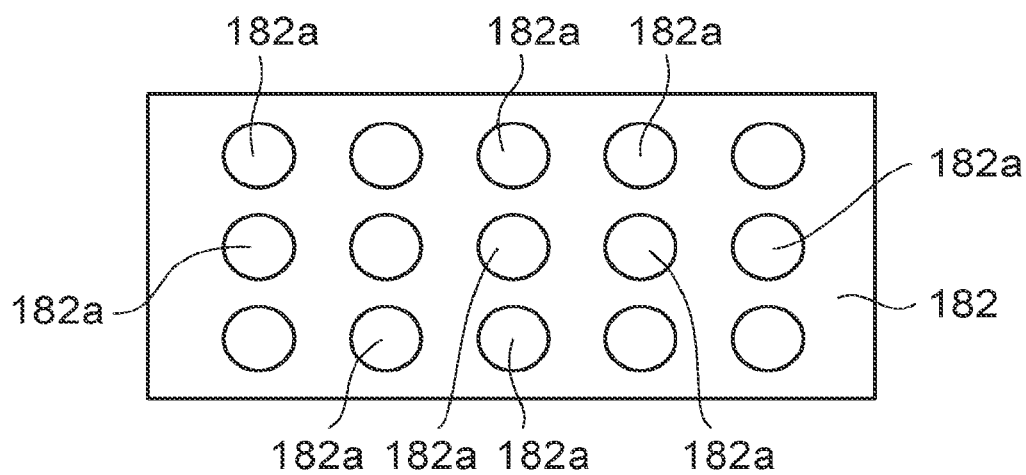
FIG. 22A is a schematic planar view showing the method for forming the semiconductor memory device of the third embodiment.
Figure 22B:
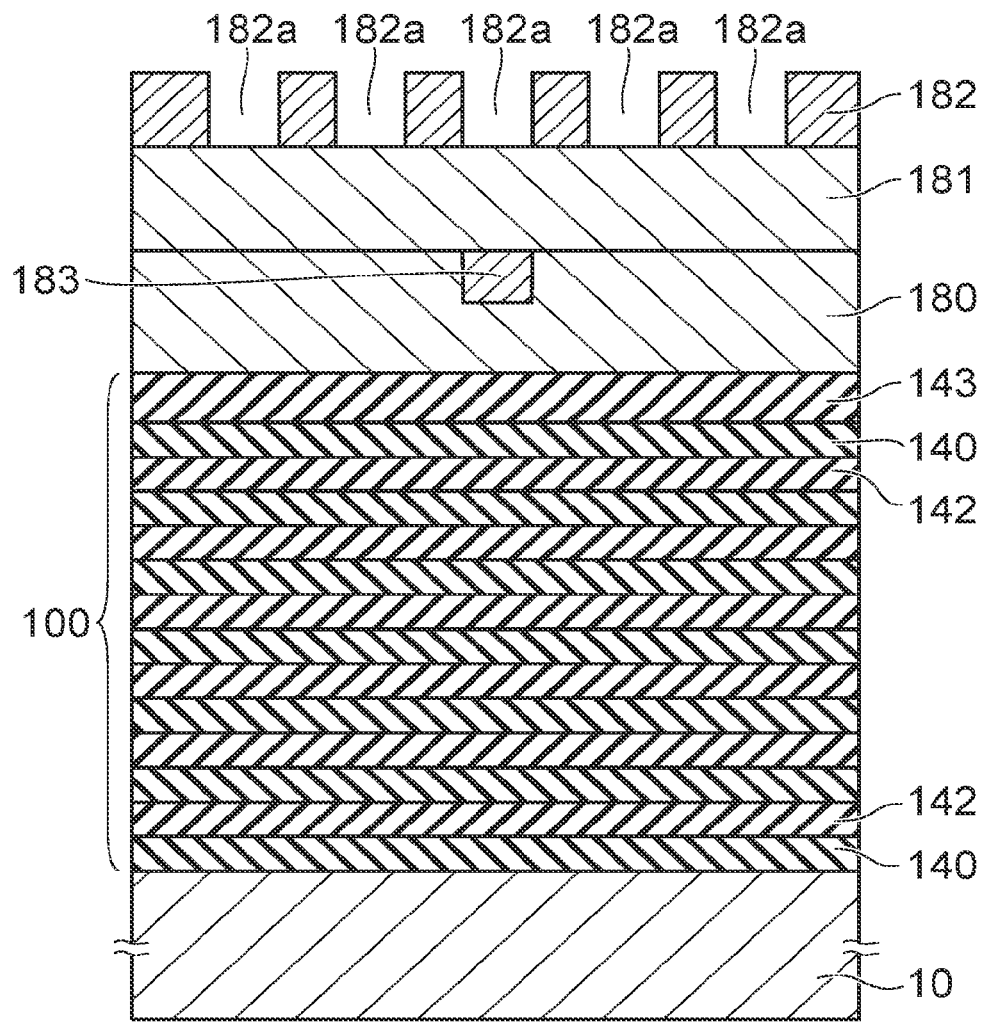
FIG. 22B is a schematic sectional view showing the method for forming the semiconductor memory device of the third embodiment.
Figure 23A:
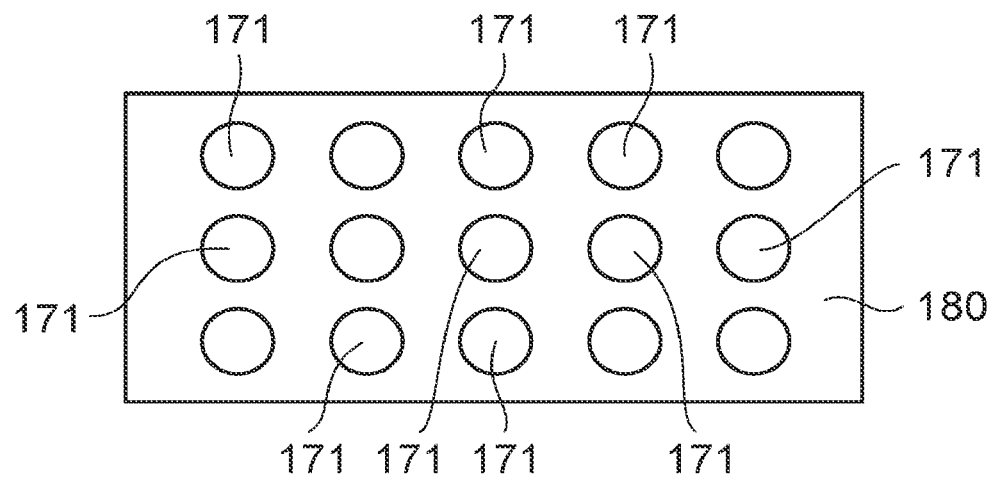
FIG. 23A is a schematic planar view showing the method for forming the semiconductor memory device of the third embodiment.
Figure 23B:
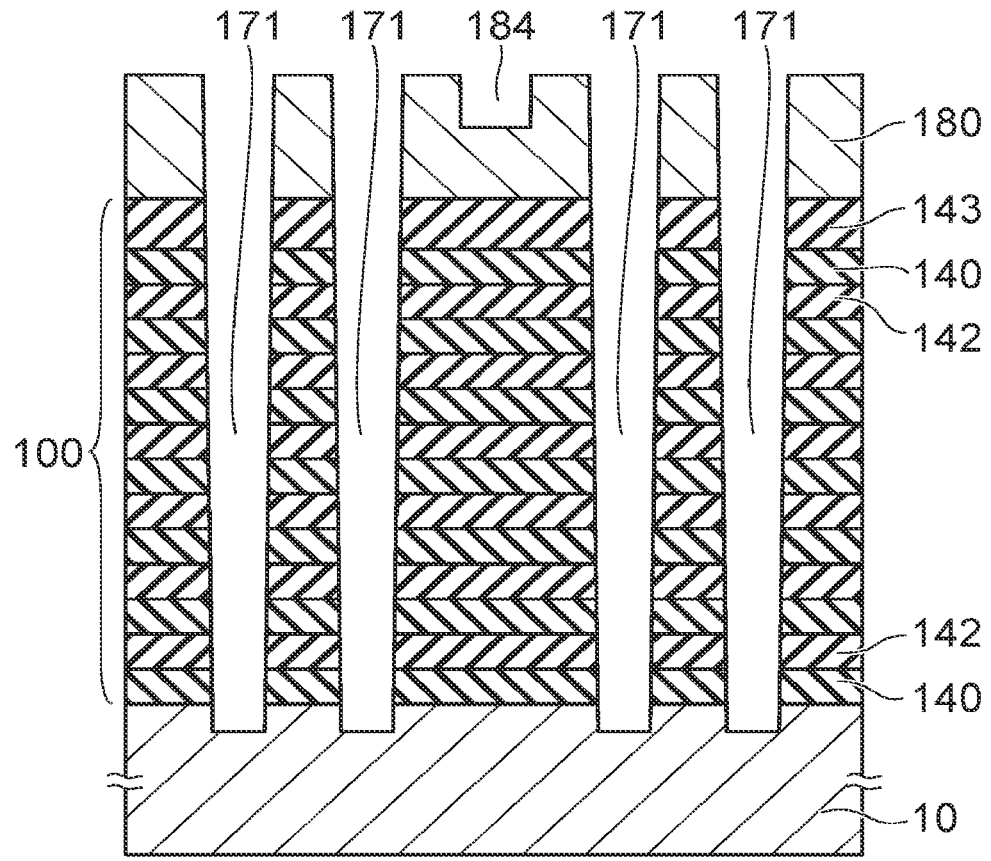
FIG. 23B is a schematic sectional view showing the method for forming the semiconductor memory device of the third embodiment.

FIGS. 21, 22B, and 23B are sectional views. FIG. 22A is a top view of FIG. 22B. FIG. 23A is a top view of FIG. 23B.

As shown in FIG. 21, the stacked body 100 is formed on the substrate 10. The stacked body 100 is a stacked body having a plurality of sacrifice layers (first layers) 142 and a plurality of insulating layers (second layers) 140. The substrate 10 is e.g. a semiconductor substrate and silicon substrate.

On the substrate 10, the insulating layers 140 and the sacrifice layers 142 are alternately formed. The process of alternately forming the insulating layer 140 and the sacrifice layer 142 is repeated at a plurality of times. The numbers of stacked sacrifice layers 142 and insulating layers 140 are not limited to the numbers of layers shown in the drawing.

The insulating layer 140 is e.g. a silicon oxide layer containing silicon oxide as a major component. The sacrifice layer 142 is a layer formed using a different kind of material from that of the insulating layer 140, e.g., a silicon nitride layer containing silicon nitride as a major component. The sacrifice layers 142 are replaced by the selection gates SGS, SGD and the electrode layers WL in the following processes.

An insulating layer 143 is formed on the uppermost insulating layer 140. The insulating layer 143 is the same kind of layer as the insulating layer 140, e.g., a silicon oxide layer containing silicon oxide as a major component.

As shown in FIG. 22B, a mask layer 180 is formed on the insulating layer 143. A stopper film 183 is buried in a part of the mask layer 180. A mask layer 181 is formed on the mask layer 180 and the stopper film 183.

The materials of the mask layers 180, 181 are different kinds of materials from that of the stacked body 100. The mask layer 180 and the mask layer 181 are formed using e.g. the same kind of material. The material of the stopper film 183 is a different kind of material from those of the mask layers 180, 181 and the stacked body 100.

A resist film 182 is formed on the mask layer 181, and the resist film 182 is patterned by exposure and development processing on the resist film 182. A plurality of holes (openings) 182a are formed in the resist film 182.

The plurality of holes 182a are regularly arranged with periodicity. For instance, as shown in FIG. 22A, the plurality of holes 182a are arranged in a square lattice.

The holes 182a form a pattern for formation of the memory holes in the stacked body 100, however, the holes 182a are also formed in positions overlapping on the stopper film 183 in which the memory holes are not formed.

The plurality of holes 182a formed in the resist film 182 are transferred to the mask layer 181 and the mask layer 180. Namely, the plurality of mask holes are formed in the mask layers 180, 181 by e.g. RIE method using the resist film 182 with the holes 182a formed therein as a mask.

Further, the stacked body 100 is etched by RIE method using the mask layers 180, 181 with the mask holes formed therein, and the plurality of memory holes 171 are formed in the stacked body 100 as shown in FIG. 23B.

The planar arrangement pattern of the mask holes corresponds to the planar arrangement pattern of the holes 182a of the resist film 182. Therefore, the mask holes are also formed in positions overlapping on the stopper film 183.

In the etching of the stacked body 100, the stopper film 183 formed using a different kind of material from that of the stacked body 100 functions as an etching stopper. The stopper film 183 is left until the processing of the stacked body 100 ends. Alternatively, the stopper film 183 may disappear at the time when the processing of the stacked body 100 ends.

In either case, etching of the part with the stopper film 183 formed therein is suppressed, and, at the time when the memory holes 171 are formed to reach the substrate 10 in the stacked body 100 under the region in which the stopper film 183 is not formed, memory holes are not formed in the stacked body 100 under the stopper film 183.

Also, in the third embodiment, at the stage of the mask pattern, the hole pattern is also formed in the regions in which the memory holes are not formed. Accordingly, the mask holes are uniformly arranged without sparse and dense regions, and deformation of the shapes and the sizes of the latent pattern of the resist film and the shapes and the sizes of the mask holes may be suppressed. Therefore, by RIE using the mask layers 180, 181, the memory holes 171 having higher roundness and less variations in diameter in the stacking direction may be formed in the stacked body 100.

As described above, according to the third embodiment, the process margin for formation of the memory holes is significantly improved, and the highly-reliable semiconductor memory device that can operate faster may be provided. Further, the number of lithography processes at high cost is not increased and the increase of the process cost is minimized. Thereby, an inexpensive semiconductor memory is realized.

The memory holes 171 penetrate the stacked body 100 and reach the substrate 10.

Next, the process after the formation of the memory holes 171 will be explained with reference to FIGS. 24 to 35.

Figure 24:
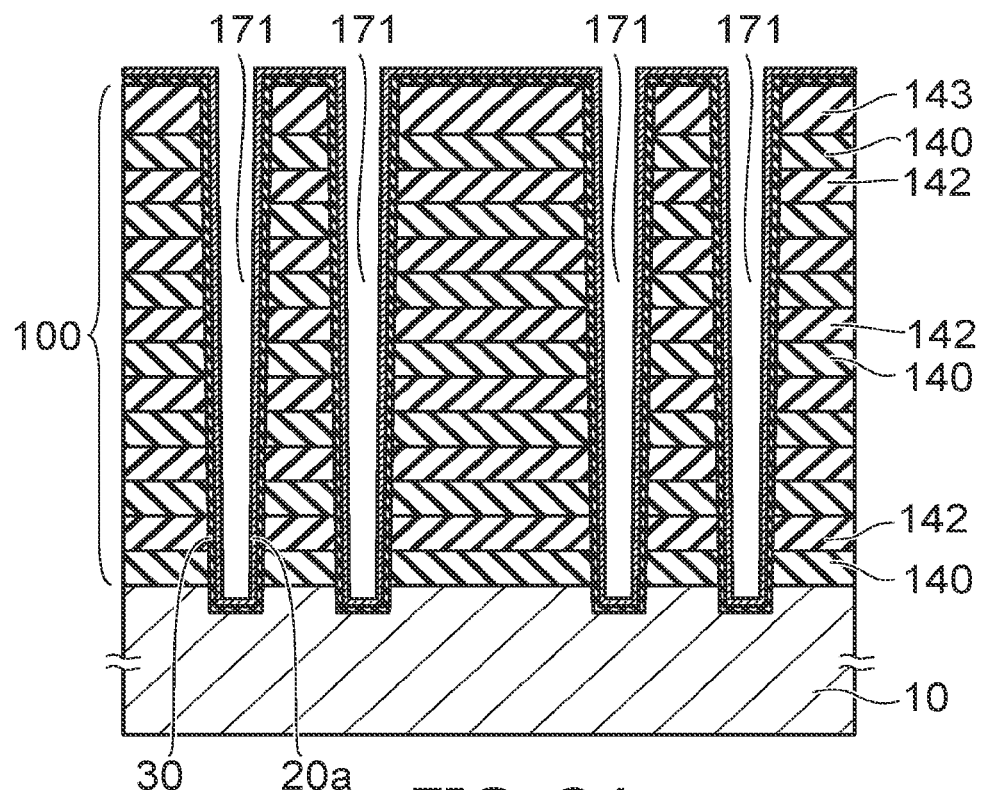
FIG. 24 to FIG. 35 are schematic sectional views showing the method for manufacturing the semiconductor memory device of the third embodiment.

As shown in FIG. 24, a memory film 30 is formed on the inner walls (side walls and bottom parts) of the memory holes 171, and a cover film 20a is formed inside of the memory film 30.

Figure 25:
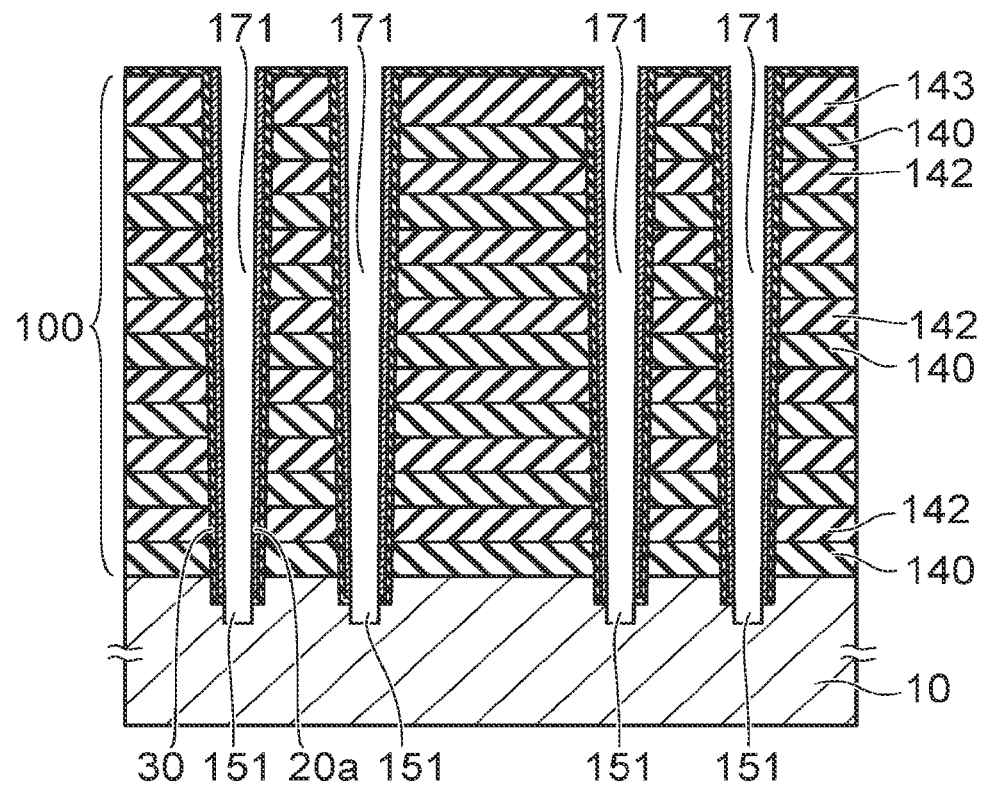

The cover film 20a and the memory film 30 formed in the bottom parts of the memory holes 171 are removed by RIE method and, as shown in FIG. 25, contact holes 151 are formed in the bottom parts of the memory holes 171. The contact holes 151 reach the substrate 10.

In the RIE, the memory films 30 formed on the side walls of the memory holes 171 are covered and protected by the cover films 20a. Therefore, the memory films 30 formed on the side walls of the memory holes 171 are not damaged by the RIE.

Figure 26:
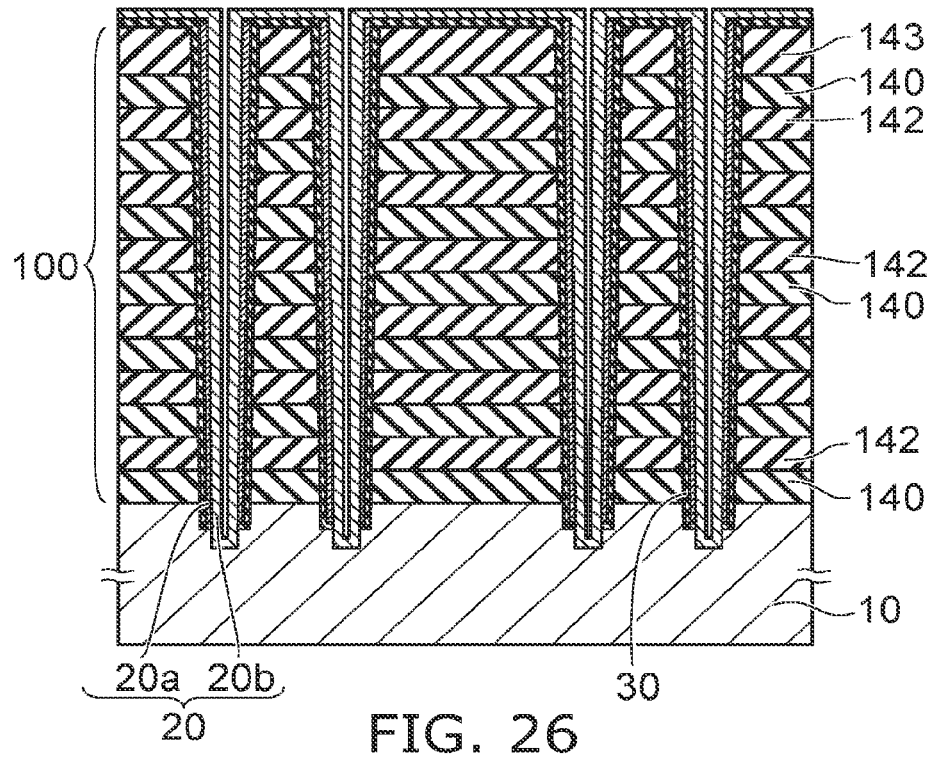

Then, as shown in FIG. 26, a channel film 20b is formed within the contact holes 151 and inside of the cover films 20a. The cover film 20a and the channel film 20b are formed as e.g. amorphous silicon films, and then, annealed into polycrystalline silicon films. The cover films 20a form a part of the above described channel films 20 with the channel film 20b.

The channel films 20 are electrically connected to the substrate 10 through the channel films 20b formed within the contact holes 151.

Figure 27:
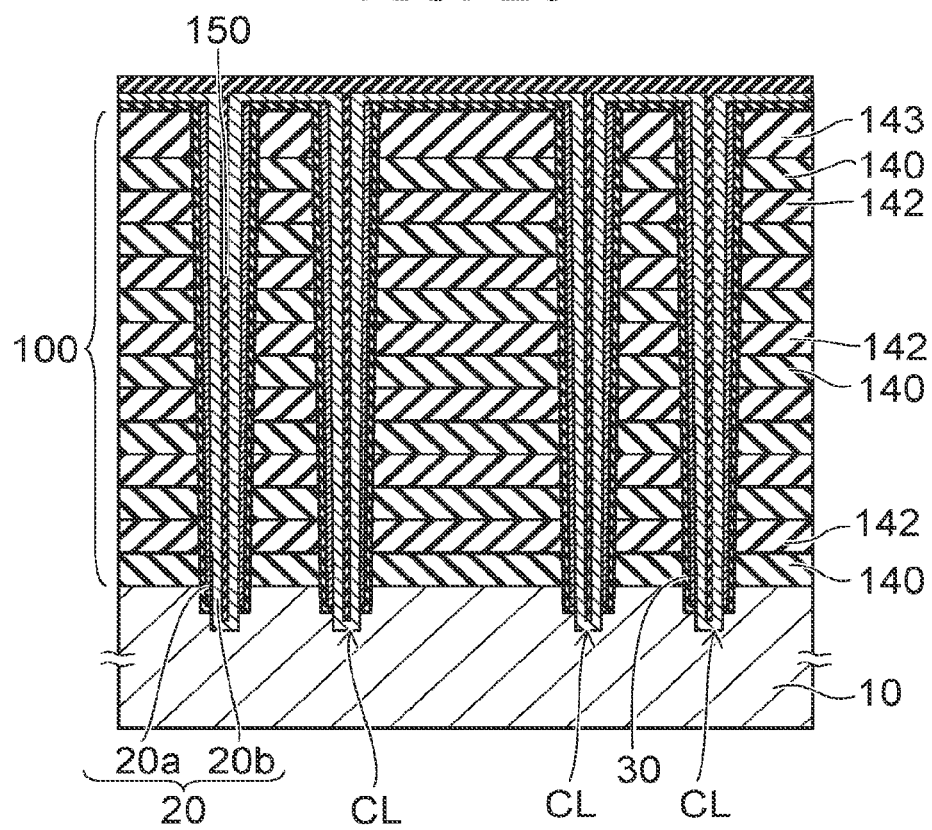
Figure 28:
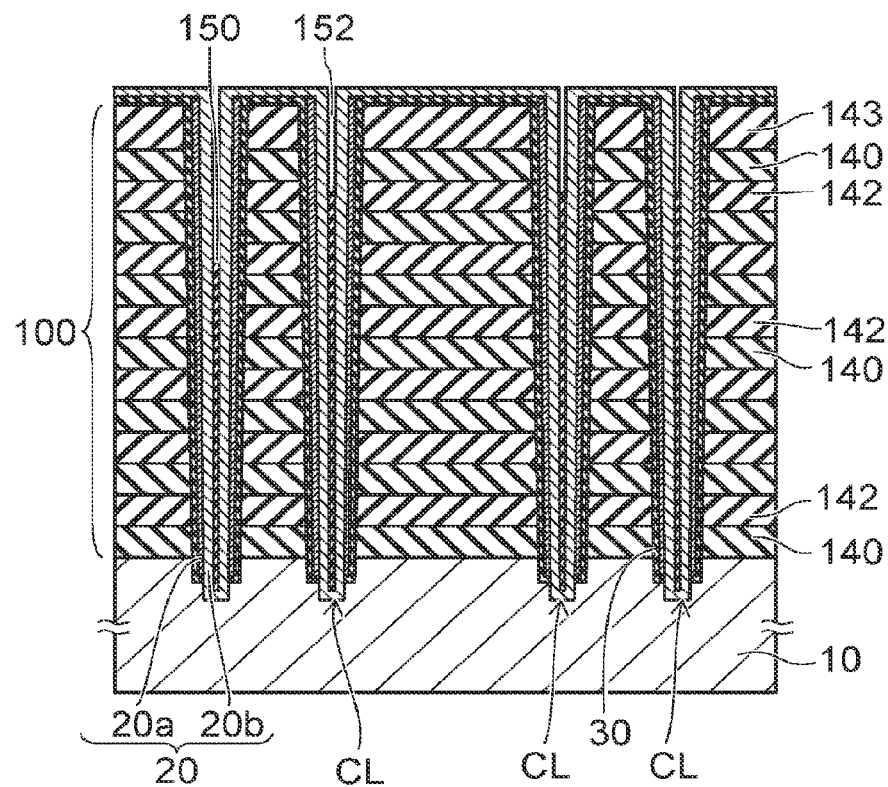

As shown in FIG. 27, core insulating films 150 are formed inside of the channel films 20b, and thereby, the columnar parts CL are formed. The upper portions of the core insulating films 150 are etched back and, as shown in FIG. 28, cavities 152 are formed in the upper portions of the columnar parts CL.

Figure 29:
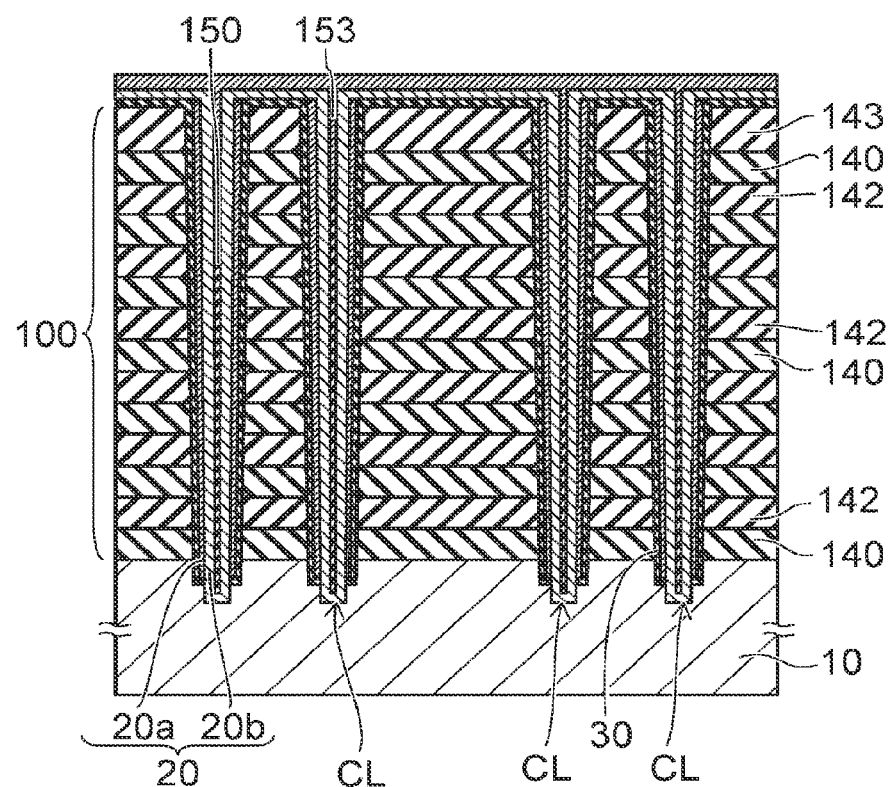

As shown in FIG. 29, semiconductor films 153 are buried within the cavities 152. The semiconductor film 153 is e.g. a doped silicon film and has higher impurity concentration than the channel film 20 as a non-doped silicon film.

In a general charge injection memory, electrons written in a charge storage layer such as a floating gate are extracted by raising the substrate potential for erasing data. As another erasing method, there is a method of boosting the channel potential of the memory cell using GIDL (Gate Induced Drain Leakage) current generated in the channel on the upper end of the drain-side selection gate.

In the embodiment, holes generated by application of a high electric field to the semiconductor film 153 with high impurity concentration formed near the upper end portion of the drain-side selection gate SGD are supplied to the channel film 20, and thereby, the channel potential is raised. When the potential of the electrode layer WL is set to e.g. the ground potential (0 V), the electrons in the charge storage film 32 are extracted by the potential difference between the channel film 20 and the electrode layer WL or the holes are injected into the charge storage film 32, and thereby, the erasing operation of data is performed.

After the semiconductor films 153 are buried within the cavities 152, the memory films 30, the channel films 20, and the semiconductor films 153 deposited on the upper surface of the stacked body 100 (the upper surface of the insulating layers 143) are removed.

Figure 30:
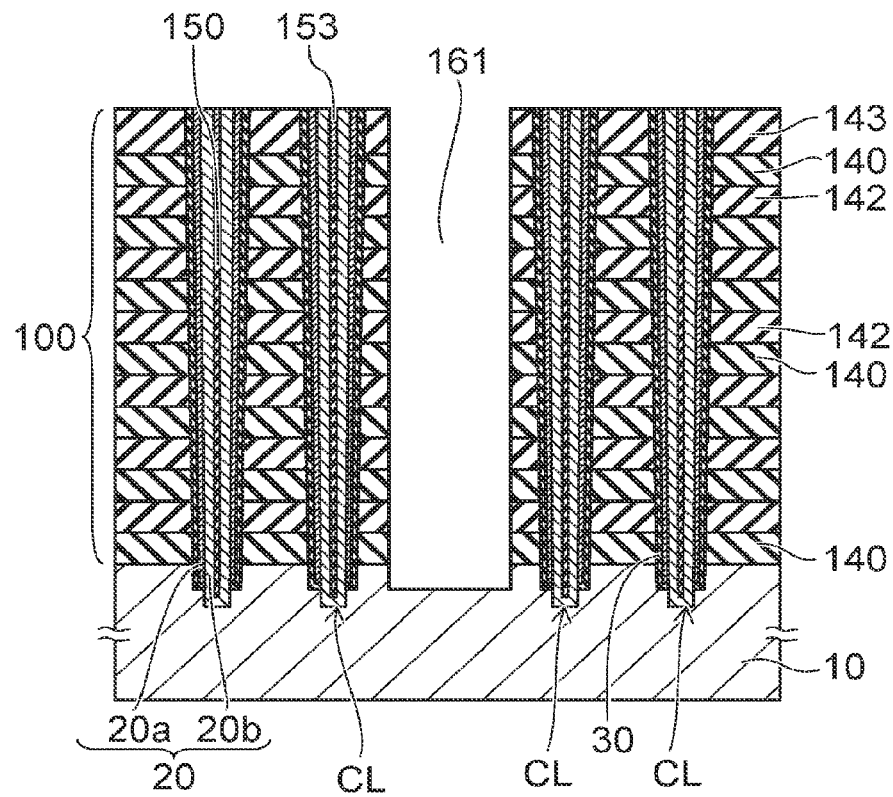

Then, as shown in FIG. 30, a slit 161 is formed in the stacked body 100 by RIE method using a mask (not shown). The slit 161 penetrates the stacked body 100 and reaches the substrate 10. The above described stopper film 183 is formed in a region in which the slit 161 is to be formed.

Figure 31:
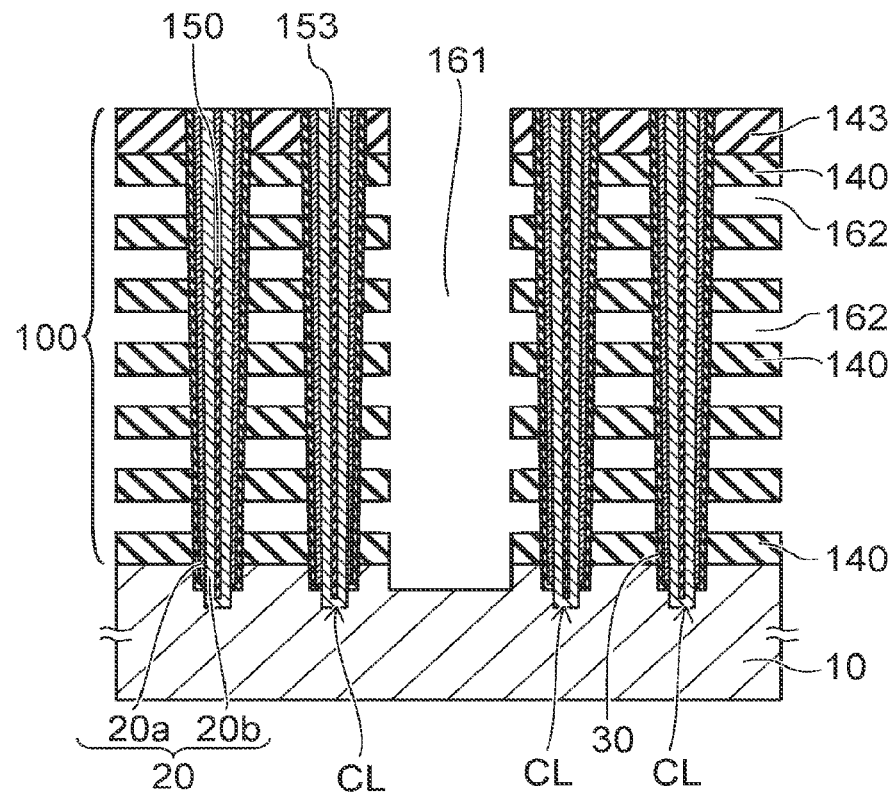

The sacrifice layers 142 are removed by etching through the slit 161. By the removal of the sacrifice layers 142, as shown in FIG. 31, a space 162 is formed between the insulating layer 140 and the insulating layer 140.

Figure 32:
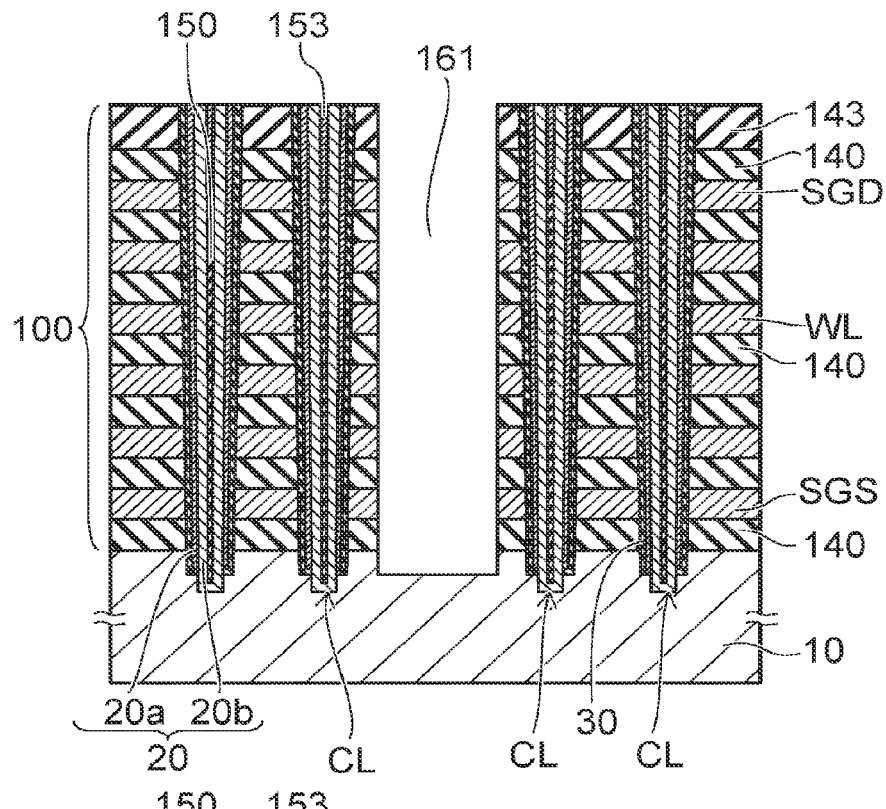

As shown in FIG. 32, the electrode layers WL, the drain-side selection gates SGD, and the source-side selection gates SGS are formed within the spaces 62 through the slit 161.

The drain-side selection gates SGD are formed in the uppermost spaces 162, the source-side selection gates SGS are formed in the lowermost spaces 162, and the electrode layers WL are formed in the spaces 162 between the uppermost and the lowermost layers.

The electrode layers WL, the drain-side selection gates SGD, and the source-side selection gates SGS are metal layers containing e.g. tungsten.

Figure 33:
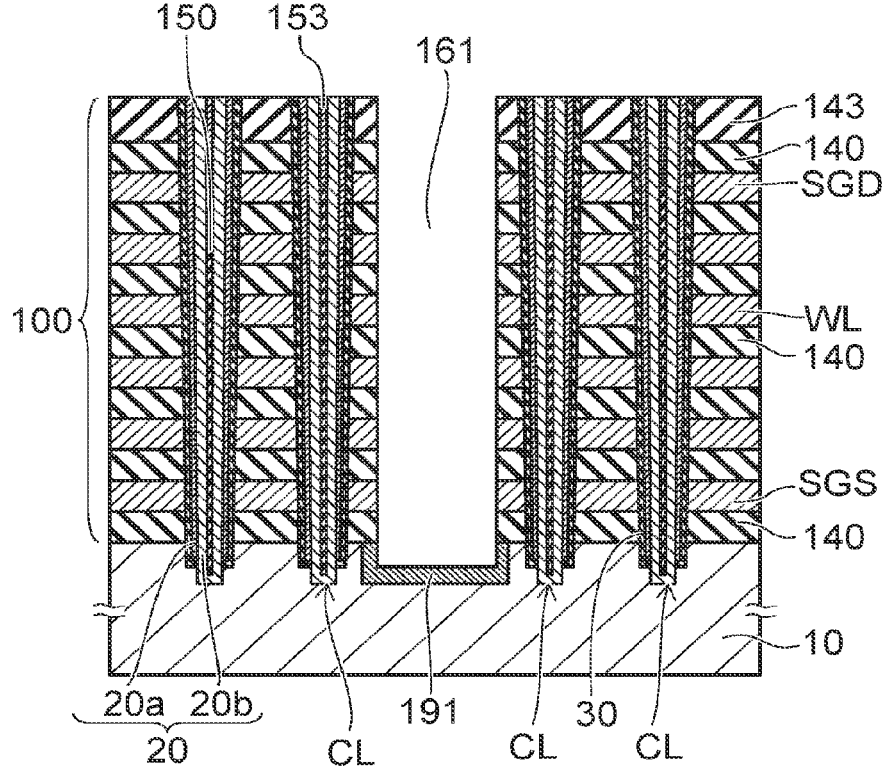

Then, an impurity is implanted into the surface of the substrate 10 at the bottom of the slit 161. By subsequent heat treatment, the implanted impurity is diffused and, as shown in FIG. 33, a contact region 191 is formed on the surface of the substrate 10 at the bottom of the slit 161.

Figure 34:
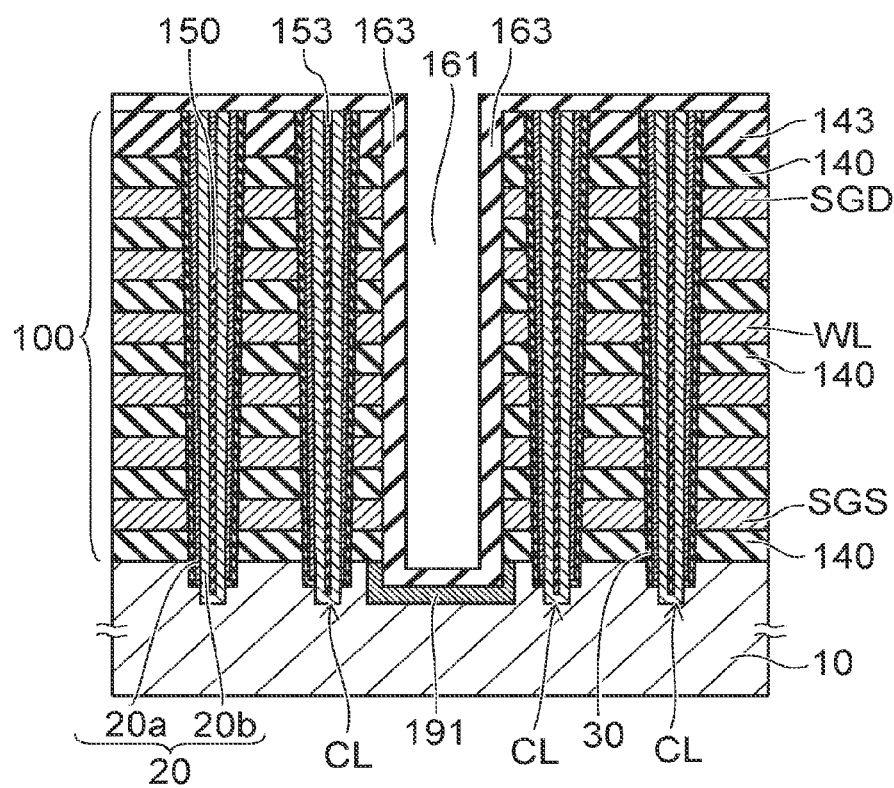

Then, as shown in FIG. 34, an insulating film 163 is formed on the inner walls (side walls and a bottom part) of the slit 161. The insulating film 163 formed in the bottom part of the slit 161 is removed by RIE method.

Then, as shown in FIG. 35, the source layer SL is buried within the slit 161. The lower end of the source layer SL is in contact with the contact region 191. The lower ends of the channel films 20 and the source layer SL are electrically connected via the contact region 191 and the substrate 10.

Then, an insulating layer 192 is formed on the stacked body 100. The drain-side selection gates SGD are separated in the Y-direction as shown in FIG. 20. Further, subsequently, the bit lines BL, the upper layer interconnection connected to the source layer SL, etc. are formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor memory device comprising:
   forming a stacked body on a substrate, the stacked body including a plurality of first layers and a plurality of second layers respectively provided between the first layers;
   forming a mask layer on the stacked body;
   forming a stopper film of a different material from a material of the stacked body in a part of the mask layer;
   forming a plurality of mask holes in the mask layer, the mask holes including a first mask hole overlapping on the stopper film;
   by etching using the mask layer, forming holes in the stacked body under other mask holes than the first mask hole on the stopper film, but not forming holes in the stacked body under the stopper film; and
   forming memory films and channel bodies in the holes.

2. The method according to claim 1, further comprising forming a slit that penetrates the stacked body and separates the stacked body into a plurality of pieces, wherein the stopper film is formed in the slit.

3. The method according to claim 2, further comprising expanding a width of an upper portion of the slit.

4. The method according to claim 2, wherein forming the stopper film includes forming a first film, and forming a second film of a different material from a material of the first film on the first film.

5. The method according to claim 4, wherein the first film includes a silicon nitride film, and the second film includes a tungsten film or a carbon film.

6. The method according to claim 3, wherein forming the stopper film includes forming a first film, and forming a second film of a different material from a material of the first film on the first film.

7. The method according to claim 6, wherein the first film includes a silicon nitride film, and the second film includes a tungsten film or a carbon film.

8. The method according to claim 3, wherein forming the stopper film includes forming a first film under the upper portion of the slit, and forming a second film of a different material from a material of the first film in the upper portion.

9. The method according to claim 8, wherein the first film includes a silicon nitride film, and the second film includes a tungsten film or a carbon film.

10. The method according to claim 3, wherein, suppose that two directions in parallel to a major surface of the substrate and orthogonal to each other are a first direction and a second direction,
    the slit extends in the first direction, and
    a width of the upper portion of the slit in the second direction is larger than a diameter of the mask hole.

11. The method according to claim 2, wherein forming the stacked body includes forming electrode layers as the first layers, and insulating layers as the second layers.

12. The method according to claim 11, further comprising:
    removing the stopper film after forming the memory films and the channel bodies in the holes;
    metal-siliciding end portions at the slit side in the electrode layers after removing the stopper film; and
    forming an insulating film in the slit after forming the metal silicide.

13. The method according to claim 1, further comprising forming a slit that separates the stacked body into a plurality of pieces after forming the memory films and the channel bodies.

14. The method according to claim 13, wherein the stopper film is formed on a region in which the slit is to be formed.

15. The method according to claim 13, further comprising:
    removing the first layers by etching through the slit; and
    forming electrode layers in spaces in which the first layers have been removed.

16. The method according to claim 15, further comprising forming a source layer in the slit.

17. The method according to claim 14, further comprising:
   removing the first layers by etching through the slit; and
   forming electrode layers in spaces in which the first layers have been removed.

18. The method according to claim 17, further comprising forming a source layer within the slit.

19. The method according to claim 1, wherein the plurality of mask holes are periodically arranged.

20. The method according to claim 19, wherein the plurality of mask holes are arranged in translational transitional symmetry.

* * * * *